United States Patent
Mabuchi

(10) Patent No.: US 12,142,625 B2
(45) Date of Patent: Nov. 12, 2024

(54) IMAGING SYSTEM WITH SELECTIVE READOUT FOR VISIBLE-INFRARED IMAGE CAPTURE

(71) Applicant: OMNIVISION TECHNOLOGIES, INC., Santa Clara, CA (US)

(72) Inventor: Keiji Mabuchi, Los Altos, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 271 days.

(21) Appl. No.: 17/957,440

(22) Filed: Sep. 30, 2022

(65) Prior Publication Data

US 2024/0113146 A1    Apr. 4, 2024

(51) Int. Cl.
*H01L 27/146* (2006.01)
*H01L 27/148* (2006.01)

(52) U.S. Cl.
CPC .. *H01L 27/14632* (2013.01); *H01L 27/14612* (2013.01); *H01L 27/14812* (2013.01); *H01L 27/1485* (2013.01); *H01L 27/14868* (2013.01); *H01L 27/14875* (2013.01)

(58) Field of Classification Search
CPC ......... H01L 27/14632; H01L 27/14612; H01L 27/14812; H01L 27/1485; H01L 27/14868; H01L 27/14875; H01L 27/14634; H01L 27/14636; H01L 27/14641; H01L 27/14649; H01L 27/14603; H04N 25/21; H04N 25/77
See application file for complete search history.

(56) References Cited

U.S. PATENT DOCUMENTS

| | | | |
|---|---|---|---|
| 7,280,143 B2 | 10/2007 | Mentzer | |
| 7,741,589 B2 | 6/2010 | Moholt et al. | |
| 8,169,519 B1 * | 5/2012 | McClatchie | H04N 23/6845 |
| | | | 348/297 |

(Continued)

FOREIGN PATENT DOCUMENTS

WO    2013027340 A1    2/2013

OTHER PUBLICATIONS

Ge, The Design of a Global Shutter CMOS Image Sensor in 110nm Technology, Master of Science Thesis, Delft University Technology Department of Electrical Engineering, Aug. 21, 2012.

(Continued)

*Primary Examiner* — Seung C Sohn
(74) *Attorney, Agent, or Firm* — Christensen O'Connor Johnson Kindness PLLC

(57) ABSTRACT

An imaging system including a sensor wafer and a logic wafer. The sensor wafer includes a plurality of pixels arranged in rows and columns, the plurality of pixels arranged in rows and columns and including at least a first pixel and a second pixel positioned in a first row included in the rows. The sensor wafer includes a first transfer control line associated with the first row, the first transfer control line coupled to both a first transfer gate of the first pixel and a second transfer gate of the second pixel. The logic wafer includes a first storage capacitor associated with the first pixel and a second storage capacitor associated with the second pixel, a first storage control line coupled to a first storage gate associated with the first pixel and a second storage control line coupled to a second storage gate associated with the second pixel.

23 Claims, 15 Drawing Sheets

(56) References Cited

U.S. PATENT DOCUMENTS

| | | |
|---|---|---|
| 8,178,938 B2 | 5/2012 | Guidash |
| 8,237,121 B2 | 8/2012 | Morin et al. |
| 8,643,750 B2 | 2/2014 | Mo et al. |
| 8,686,342 B2 | 4/2014 | Hong et al. |
| 9,293,500 B2 | 3/2016 | Sharma et al. |
| 9,461,088 B2 | 10/2016 | Yi |
| 9,615,031 B2 | 4/2017 | Katoh et al. |
| 9,843,754 B1 * | 12/2017 | Yi ................. H04N 25/626 |
| 9,888,198 B2 | 2/2018 | Mauritzson et al. |
| 10,051,211 B2 | 8/2018 | Chen et al. |
| 10,291,859 B2 | 5/2019 | Tanaka et al. |
| 10,462,402 B2 | 10/2019 | Fan |
| 10,680,711 B2 | 6/2020 | Darabi |
| 10,986,290 B2 | 4/2021 | Manabe et al. |
| 11,006,055 B2 | 5/2021 | Sugiyama |
| 11,240,454 B2 | 2/2022 | Gao et al. |
| 2011/0228096 A1 | 9/2011 | Friel et al. |
| 2012/0188424 A1 | 7/2012 | Li |
| 2013/0057754 A1 | 3/2013 | Shimada et al. |
| 2013/0229560 A1 | 9/2013 | Kondo |
| 2014/0240492 A1 | 8/2014 | Lee |
| 2015/0054973 A1 | 2/2015 | Velichko |
| 2015/0341573 A1 | 11/2015 | Matsuo et al. |
| 2017/0104946 A1 | 4/2017 | Hong |
| 2018/0220094 A1 | 8/2018 | Yang et al. |
| 2021/0029316 A1 | 1/2021 | Lee et al. |
| 2021/0075983 A1 | 3/2021 | Tang et al. |
| 2021/0112214 A1 | 4/2021 | Machida et al. |
| 2021/0199809 A1 | 7/2021 | Wynn |
| 2021/0337144 A1 | 10/2021 | Wang et al. |

OTHER PUBLICATIONS

Zhao, High Speed Camera Chip, Arizona State University, May 2017.
U.S. Appl. No. 17/957,451, filed Sep. 30, 2022, 100 pages.
Non-Final Office Action issued Aug. 29, 2024, in corresponding U.S. Appl. No. 17/957,451, filed Sep. 30, 2022, 28 pages.

* cited by examiner ns, materials, etc. In other instances, well-known structures, materials, or operations are not shown or described in detail to avoid obscuring certain aspects.
IMAGING SYSTEM WITH SELECTIVE READOUT FOR VISIBLE-INFRARED IMAGE CAPTURE

TECHNICAL FIELD

This disclosure relates generally to image sensors, and in particular but not exclusively, relates CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is readout as analog image signals from the column bitlines and converted to digital values to produce digital images (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1A:
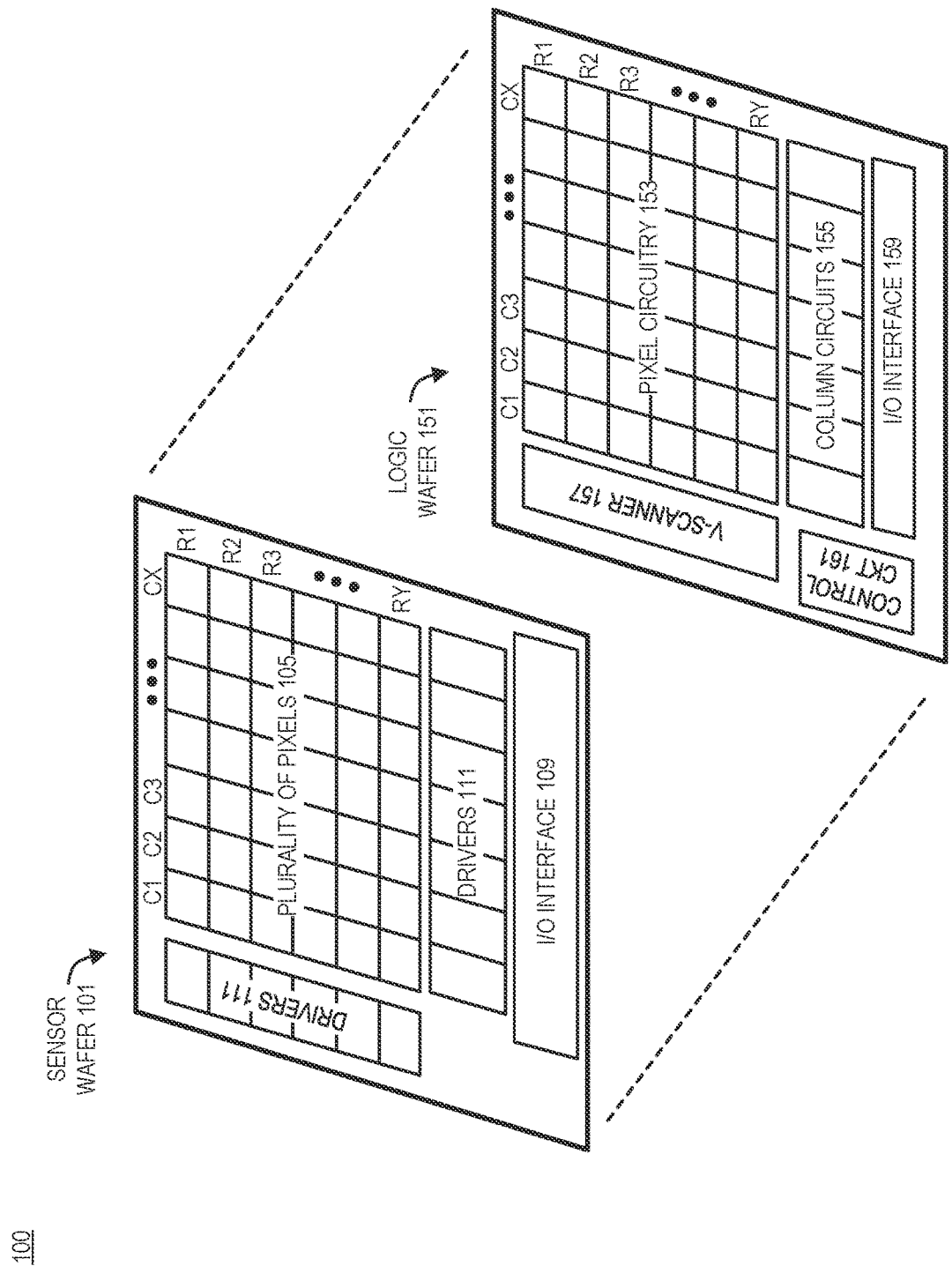
FIG. 1A illustrates an example imaging system including a sensor wafer and a logic wafer that provide selective readout for visible-infrared image capture, in accordance with the teachings of the present disclosure.

Embodiments of an apparatus, system, and method each related to an image sensor with selective readout for visible-infrared image capture are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Described herein are embodiments of an imaging system with selective readout for visible-infrared image capture and methods thereof. In some embodiments, an individual image sensor, which may have a stacked chip scheme, is utilized to capture both visible images (e.g., color) and non-visible images (e.g., near-infrared, infrared, short-wave infrared, far-infrared, or other frequency ranges outside of the visible spectrum of electromagnetic radiation) of an external scene. This may be achieved, at least in part, by an image sensor architecture that provides selective readout to storage nodes of the image sensor. Specifically, image frames may be captured using multiple exposure periods, which includes a long exposure period associated with visible image light and a short exposure period associated with non-visible image light (e.g., near-infrared, infrared, short-wave infrared, far-infrared, or other frequency ranges outside of the visible spectrum of electromagnetic radiation). In some embodiments, storage control lines associated with the storage nodes may be configured to provide independent readout to the storage nodes even when individual storage nodes are associated with a common row to enable each image frame captured by the image sensor to include image data associated with both the long exposure period and the short exposure period.

Advantageously, the long and short exposure periods when capturing a given image frame with the image sensor or imaging system combined with selective readout to the storage nodes allow for reduced crosstalk between visible and non-visible image data. In some embodiments, the duration of the short exposure period may be tailored based on the time it takes for a non-visible light source to illuminate the external scene (or more specifically the total time for the non-visible light to illuminate the external scene and reflect back upon the image sensor or imaging system), which subsequently can be utilized to increase the duration of the long exposure period. In other words, a duration ratio of the long exposure period with respect to the short exposure period may be increased to avoid sacrificing sensitivity of the visible image data while maintaining a sufficient duration for the short exposure period to generate non-visible image data. It is appreciated that the non-visible image data may be utilized to generate an illuminated image without disturbing human eyes or vision, a depth map of the external scene, and/or to determine a distance one or more pixels are from the external scene. Thus, by reducing the duration of the short exposure period, an influence of ambient light on the non-visible image data may be reduced or otherwise mitigated. Further still, the increased ratio between the long exposure period and the short exposure period mitigates flickering present in the external scene from being obscured. This is particularly helpful during video capture in which image frames are continuously captured and a non-visible image of the external scene is desired for each of the image frames.

While most embodiments described herein are discussed in the context of capturing image frames including both visible and non-visible image data, it is appreciated that other embodiments may capture image frames with only visible image data and/or only non-visible image data over multiple exposure periods. In particular, certain embodiments described herein may be useful in capturing high dynamic range visible or non-visible images using multiple exposure periods.

Figure 6:
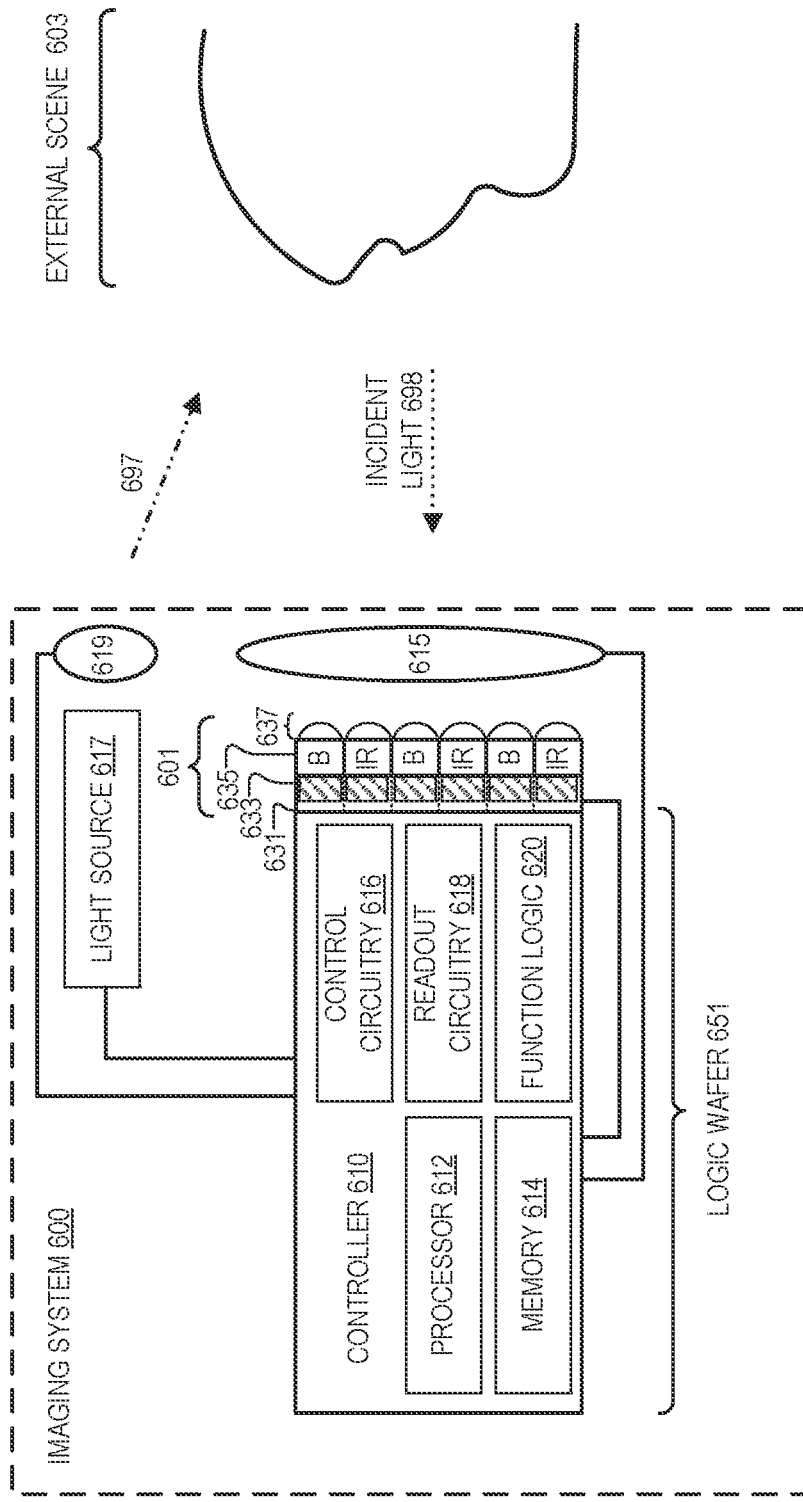
FIG. 6 illustrates a block diagram of an imaging system with selective readout for visible-infrared image capture, in accordance with the teachings of the present disclosure.

FIG. 1A illustrates an example imaging system 100 including a sensor wafer 101 and a logic wafer 151 that provides selective readout for visible-infrared image capture, in accordance with the teachings of the present disclosure. The sensor wafer 101 includes a plurality of pixels 105, drivers 111, and an input/output (I/O) interface 109. The logic wafer 151 includes pixel circuitry 153, column circuits 155, v-scanner 157, I/O interface 159, and control circuitry 161. In the illustrated embodiment, the imaging system 100 includes a stacked complementary metal oxide semiconductor (CMOS) image sensor formed, at least in part, by sensor wafer 101 (e.g., a first die) and logic wafer 151 (e.g., a second die) that are stacked and coupled together (e.g., electrically and/or physically) in a stacked chip scheme. It is appreciated that while only the sensor wafer 101 and the logic wafer 151 are illustrated in FIG. 1A, the stacked chip scheme of the imaging system 100 may include additional dies that may be integrated into the stacked chip scheme. Additionally, it is appreciated that the view presented in FIG. 1A may omit certain elements of the imaging system 100 to avoid obscuring details of the disclosure (e.g., a light source to emit electromagnetic radiation towards an external scene as illustrated in FIG. 6, other components illustrated in FIG. 6, and/or other components not expressly illustrated). In other words, not all elements of the imaging system 100 may be labeled, illustrated, or otherwise shown within FIG. 1A. It is further appreciated that in some embodiments, the imaging system 100 may not necessarily include all elements shown.

The stacked chip scheme illustrated in FIG. 1A distributes components of the imaging system 100 across multiple dies. Specifically, the sensor wafer 101 includes photosensitive elements (e.g., photodiodes, pinned photodiodes, or the like) included in the plurality of pixels 105 while the logic wafer 151 includes pixel circuitry 153 associated with the plurality of pixels 105 (see, e.g., FIG. 1D). Put in another way, the logic wafer 151 offloads at least part of the circuitry associated with the plurality of pixels 105 of the sensor wafer 101, which advantageously provides additional space on the sensor wafer 101. The plurality of pixels 105 may be coupled to the pixel circuitry 153 through one or more hybrid bonds, through-silicon vias, combinations thereof, or other suitable circuit coupling technologies. In some embodiments, the space saved on the sensor wafer 101 by offloading circuitry to the logic wafer 151 may be repurposed to increase the size of individual photodiodes included in the plurality pixels 105 to allow for increased pixel size, density, sensitivity, combinations thereof, or the like. Additionally, or alternatively, functionality of the imaging system 100 may be facilitated as the logic wafer 151 may have room for additional components or circuitry that may not otherwise fit on an individual wafer or substrate that contains both the plurality of pixels 105 and the pixel circuitry 153 without affecting the performance and/or functionality of the imaging system 100.

In the illustrated embodiment, the imaging system 100 comprises the sensor wafer 101 and the logic wafer 151 coupled to the sensor wafer 101. The sensor wafer 101 includes the plurality of pixels 105, which include individual pixels arranged in rows (e.g., R1, R2, R3, RY) and columns (e.g., C1, C2, C3, CX) to form an array of pixels. The plurality of pixels 105 may include any number of pixels including at least a first pixel and a second pixel. In the same or other embodiments, the plurality of pixels 105 may further include a third pixel and a fourth pixel. Collectively, the first, second, third, and fourth pixel may form a minimal repeating unit of sensor wafer 101, or more specifically, the plurality of pixels 105. In some embodiments, the first pixel and the second pixel share a first common row (e.g., each of the first pixel and the second pixel may be arranged in an individual one of the rows, such as R1, R2, R3, or any other row included in the rows). In the same or other embodiments, the third pixel and the fourth pixel share a second common row different than the first common row (e.g., each of the third pixel and the fourth pixel may be arranged in an individual one of the rows, such as R1, R2, R3, or any other row included in the rows other than the first common row). In some embodiments, the first pixel is adjacent to the second pixel such that there is no intervening pixel between the first pixel and the second pixel along the first common row. In the same or other embodiments, the third pixel is adjacent to the fourth pixel such that there is no intervening pixel between the third pixel and the fourth pixel along the second common row. In the same or other embodiments, the first common row is adjacent to the second common row such that there is no intervening row included in the rows between the first common row and the second common row.

As discussed above, each given pixel included in the plurality of pixels 105 may include single or multiple photosensitive elements (e.g., one or more photodiodes) configured to generate a response to incident light (e.g., accumulate photogenerated image charge), which may be transferred to a corresponding floating diffusion region associated with the given pixel. In some embodiments, the plurality of pixels 105 of the sensor wafer 101 is operated in response to a global shutter signal. In other words, the accumulated image charges may be transferred from respective photodiode regions included in the plurality of pixels 105 to corresponding floating diffusion regions in response to a global shutter signal. In some embodiments, the pixel circuitry 153 includes a plurality of storage nodes (e.g., one or more reset storage capacitors and one or more storage capacitors to respective read out levels of the floating diffusion regions after reset and accumulation of photogenerated carriers), each of which associated with one or more pixels included in the plurality of pixels 105. In some embodiments, the plurality of storage nodes are configured to respectively store image signal level and reset signal levels for each of the plurality of pixels 105. In some embodiments, the logic wafer 151 may operate on a row-by-row basis. In other words, image data may be generated based on the plurality of storage nodes of the logic wafer 151 being readout on a row-by-row basis, which contrasts with the simultaneous readout from the global shutter signal of the sensor wafer 101. It is appreciated that in some embodiments the pixel circuitry 153 is configured to provide selective readout from the plurality of storage nodes to facilitate capturing image frames with multiple exposure periods. Advantageously, this approach allows for the advantages of a global shutter (e.g., mitigated rolling shutter artifacts) while still maintaining the low noise advantage facilitated by the row-by-row readout from the plurality of storage nodes.

As illustrated in FIG. 1A, the sensor wafer 101 and the logic wafer 151 include various analog and/or digital support circuitry for the imaging system 100. In some embodiments, the support circuitry includes, but is not limited to, row and column decoders and drivers (e.g., drivers 111), analog signal processing chains, digital imaging processing blocks, memory, timing and control circuits (e.g., control circuit 161), input/output (I/O) interfaces (e.g., I/O interface 109 and 159), a vertical scanner (e.g., v-scanner 157), sample and hold circuitry, amplifiers, analog-to-digital converter circuitry (e.g., column circuits 155), digital processor, and any other embodiments of logic circuits that are appropriate for the function of the imaging system 100.

Figure 1B:
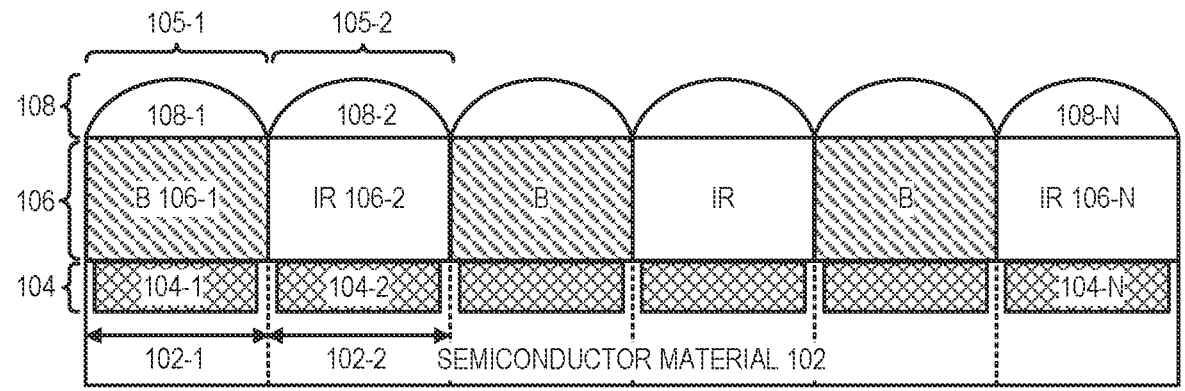
FIG. 1B illustrates a cross-sectional view of the sensor wafer included in the imaging system of FIG. 1A, in accordance with the teachings of the present disclosure.

FIG. 1B illustrates a cross-sectional view 100-A of the sensor wafer 101 included in the imaging system 100 of FIG. 1A, in accordance with the teachings of the present disclosure. More specifically, the cross-sectional view 100-A is a partial cross-section showing a row of pixels (e.g., a first row) included in an array of pixels formed by the plurality of pixels 105 illustrated in FIG. 1A. Referring back to FIG. 1B, the plurality of pixels 105 include a plurality of photodiodes 104 formed in a semiconductor material 102 (e.g., a silicon wafer or substrate, a silicon germanium alloy, germanium, a silicon carbide alloy, an indium gallium arsenide alloy, any other alloys formed of III-V compounds, other semiconductor materials or alloys, combinations thereof or bulk substrate, corresponding to, or otherwise included in, the sensor wafer 101), a plurality of color filters 106 (e.g., red, green, blue, infrared, clear, transparent, cyan, magenta, yellow, black, or any other color filter to filter visible or non-visible light that would otherwise be incident on an optically aligned photodiode included in the plurality of photodiodes 104), and a plurality of microlenses 108. In some embodiments, each pixel (e.g., first pixel 105-1, second pixel 105-2, or any other unlabeled individual pixel included in the plurality of pixels 105) includes an optically aligned stack of at least one of the plurality of photodiodes 104, at least one of the plurality of color filters 106, and at least one of the plurality of microlenses 108. As illustrated, the plurality of color filters 106 are disposed between the plurality of photodiodes 104 and the plurality of microlenses 108. It is appreciated that the view 100-A illustrates an individual row included in the array of pixels formed by the plurality of pixels 105, which may have "N" elements per row. In other words, each row included in the rows may have N photodiodes included in the plurality of photodiodes 104, N color filters included in the plurality of color filters 106, and N microlenses included in the plurality of microlenses 108, where N corresponds to an integer greater than two. Thus, photodiode 104-N, color filter 106-N, and microlens 108-N each correspond to the Nth element within the row illustrated in view 100-A. Accordingly, in the illustrated embodiment there is a one-to-one correspondence between photodiodes included in the plurality of photodiodes 104, color filters included in the plurality of color filters 106, and microlenses included in the plurality of microlenses 108. However, in other embodiments, there may be a correspondence different from one-to-one. In one embodiment, individual microlenses may be optically aligned (e.g., shared) with more than one color filter included in the plurality of color filters 106 and/or more than one photodiode included in the plurality of photodiodes 104.

In the illustrated embodiment, the first pixel 105-1 included in the plurality of pixels 105 includes a first photodiode 104-1 included in the plurality of photodiodes 104 disposed in a first portion 102-1 of the semiconductor material 102, a first color filter 106-1 (e.g., a blue color filter) included in the plurality of color filters 106 and a first microlens 108-1 included in the plurality of microlenses 108. As illustrated, the first photodiode 104-1, the first color filter 106-1 and the first microlens 108-1 are optically aligned with one another to form the first pixel 105-1. Adjacent to the first pixel 105-1 is the second pixel 105-2 (e.g., there are no intervening pixels between the first pixel 105-1 and the second pixel 102-2), which includes a second photodiode 104-2 included in the plurality of photodiodes 104 disposed in a second portion 102-2 of the semiconductor material 102, a second color filter 106-2 (e.g., an infrared or "IR" filter) included in the plurality of color filters 106, and a second microlens 108-2 included in the plurality of microlenses 108. It is appreciated that in some embodiments, an IR filter (e.g., the second color filter 106-2 or any other IR filter included in the plurality of color filters 106) may correspond to a clear or transparent color filter that allows for transmission of near-infrared, infrared, or far-infrared light (e.g., light having a wavelength between 800 nm to 3000 nm). Accordingly, it is appreciated that in some embodiments an IR filter included in the plurality of color filters 106 does not necessarily attenuate light within the visible range (e.g., approximately 300 nm to 800 nm) of the electromagnetic spectrum. In other embodiments, IR filters included in the plurality of color filters 106 attenuate (e.g., via reflection, diffraction, absorption, or otherwise) incident light outside of the infrared range (e.g., approximately 800 nm to 3000 nm) of the electromagnetic spectrum. It is appreciated that color filters associated with the visible range of the electromagnetic spectrum (e.g., red, green, blue, or otherwise) may attenuate incident light outside of the named color (e.g., a blue color filter attenuates visible light outside a region of the visible range of the electromagnetic spectrum corresponding to blue, a green color filter attenuates visible light outside of a region of the visible range of the electromagnetic spectrum corresponding to green, and so on).

As discussed above, the cross-sectional view 100-A illustrated in FIG. 1B of the imaging system 100 illustrated in FIG. 1A may not include all elements to avoid obscuring certain aspects of the disclosure. In some embodiments, the imaging system 100 may further include one or more doped semiconductor regions to form the plurality of photodiodes 104 (e.g., one or more photodiodes, pinned photodiodes, or the like) in the semiconductor material 102, isolation structures (e.g., shallow trench isolation structures, deep trench isolation structures, and the like disposed between adjacent photodiodes included in the plurality of photodiodes 104), metal grid structures (e.g., one or more metal structures disposed between adjacent color filters included in the plurality of color filters 106), attenuation layers, anti-reflection films, filters, or other components.

Figure 1C:
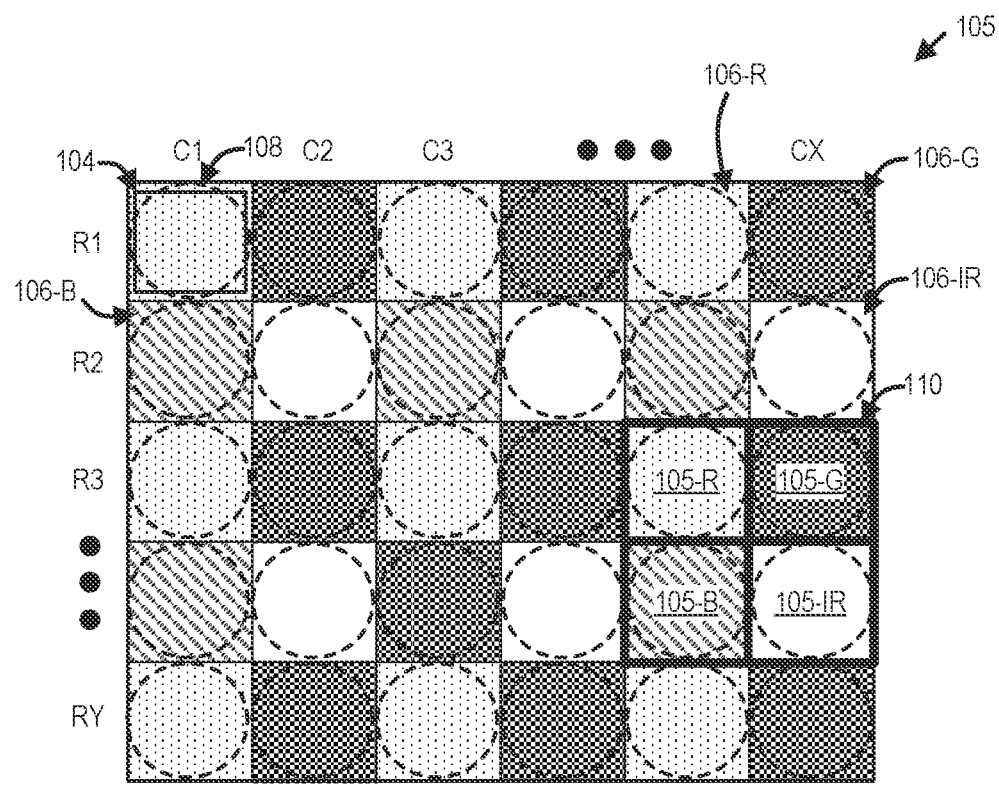
FIG. 1C illustrates a top view of the sensor wafer included in the imaging system of FIG. 1A, in accordance with the teachings of the present disclosure.

FIG. 1C illustrates a top view 100-B of the sensor wafer 101 included in the imaging system of FIG. 1A, in accordance with the teachings of the present disclosure. More specifically, the top view 100-B illustrates the pixel array formed by the plurality of pixels 105 illustrated in FIG. 1A. Referring back to FIG. 1C, the view 100-B shows the plurality of pixels 105 arranged in rows (e.g., R1, R2, R3, RY) and columns (e.g., C1, C2, C3, . . . CY). The rows (e.g., R1, R2, R3, and so on) may be represented by the view 100-A illustrated in FIG. 1B. For example, a cross-sectional view of row "R2" illustrated in FIG. 1C may correspond to the view 100-A illustrated in FIG. 1B. Referring back to FIG. 1C, each of the plurality of pixels 105 include one photodiode included in the plurality of photodiodes 104, one color filter included in the plurality of color filters 106, and one microlens included in the plurality of microlenses 108. In the illustrated embodiment, the plurality of pixels 105 have a regular and repeated arrangement such that a two-by-two group of adjacent pixels included in the plurality of pixels 105 with a red color filter (e.g., 106-R), a green color filter (e.g., 106-G), a blue color filter (e.g., 106-B), and an infrared color filter (e.g., 106-IR) form one of a plurality of pixel cells (e.g., pixel cell 110), each of which is analogous to (i.e., corresponds to) a minimal repeating unit of the plurality of pixels 105. As illustrated in FIG. 1C, the pixel cell 110 includes a blue pixel 105-B (e.g., a first pixel corresponding to 105-1 illustrated in FIG. 1B), an infrared pixel 105-IR (e.g., a second pixel corresponding to 105-2 illustrated in FIG. 1B), a red pixel 105-R (e.g., a third pixel), and a green pixel 105-G (e.g., a fourth pixel). In the illustrated embodiment, the first pixel (e.g., 105-B), the second pixel (e.g., 105-IR), the third pixel (e.g., 105-R), and the fourth pixel (e.g., 105-G) are adjacent to one another to form a first pixel cell (e.g., pixel cell 110) included in a plurality of pixel cells of the imaging system (e.g., the imaging system 100 illustrated in FIG. 1A). It is appreciated that in some embodiments, the different color filters included in the plurality of color filters 106 (e.g., 106-B, 106-IR, 106-R, and/or 106-G) may have different spectral photoresponses to various wavelengths of light within the electromagnetic spectrum. In one embodiment, the second pixel (e.g., 105-IR) of the first pixel cell (e.g., pixel cell 110) is more sensitive to a first wavelength (e.g., one or more discrete wavelengths included in the infrared range of the electromagnetic spectrum such as any wavelength between 800 nm and 3000 nm) than the first pixel (e.g., 105-B, 105-G, and/or 105-R). In other words, a second transmissivity for the first wavelength through a corresponding color filter included in the plurality of color filters 106 of the second pixel (e.g., an IR color filter) is greater than a first transmissivity for the first wavelength through a corresponding color filter included in the plurality of color filters 106 of the first pixel (e.g., a red, green, and/or blue color filter).

Figure 1D:
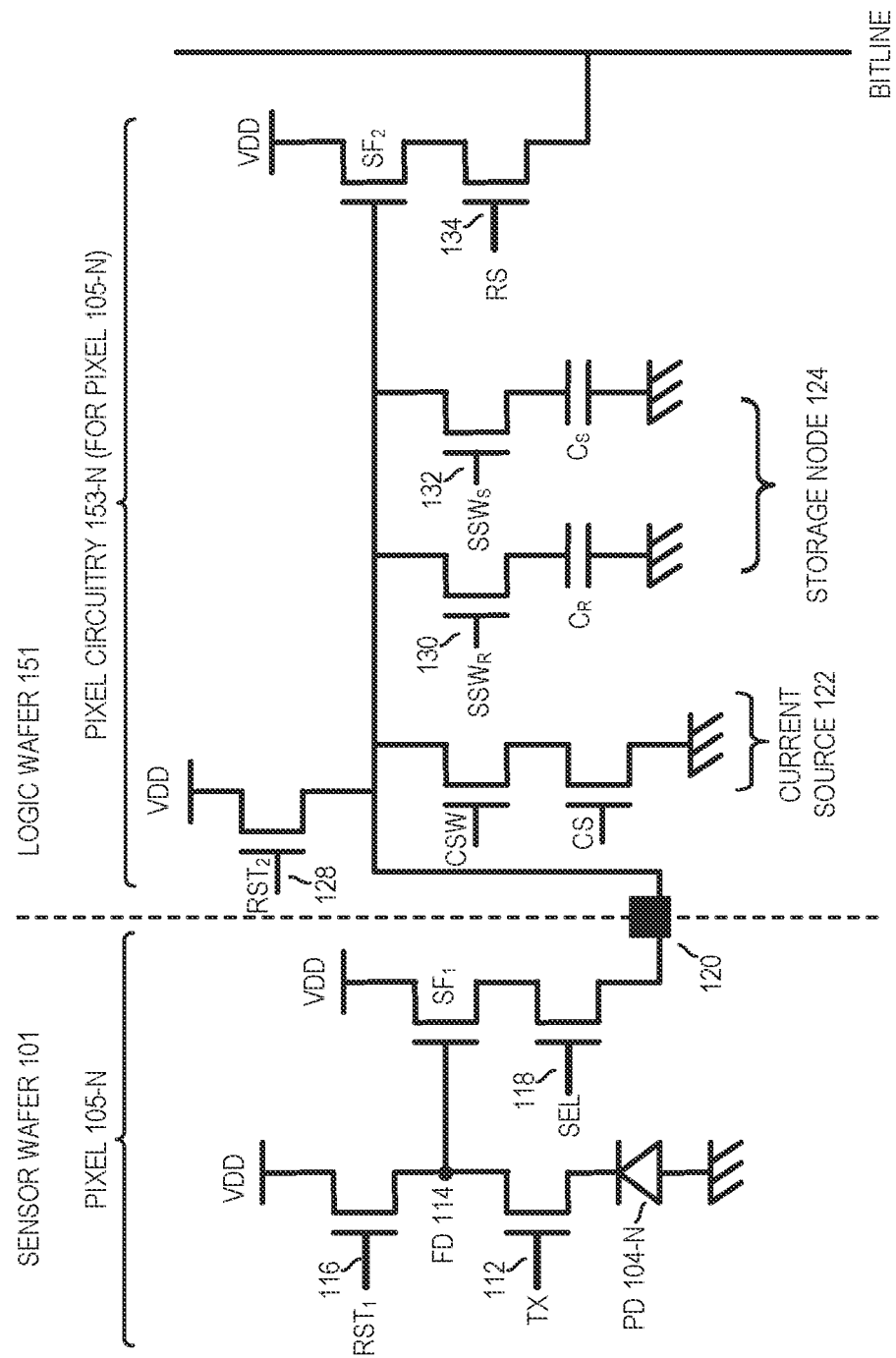
FIG. 1D illustrates an example pixel circuit for an individual pixel included in the imaging system illustrated in FIG. 1A, in accordance with the teachings of the present disclosure.

FIG. 1D illustrates an example pixel circuit 150 for an individual pixel 105-N included in the plurality of pixels 105 of the imaging system illustrated in FIG. 1A, in accordance with the teachings of the present disclosure. More specifically, the schematic illustrated in FIG. 1D, is representative of the pixel 105-N and associated pixel circuitry 153-N. For discussion purposes, a portion of circuitry included in the pixel circuitry 153 that is associated with the pixel 105-N and located in or on the logic wafer 151 is referred to as pixel circuitry 153-N. However, it is appreciated that in the illustrated embodiment, the pixel 105-N also includes circuitry located on the sensor wafer 101. Accordingly, as discussed in embodiments herein, the term "pixel" includes at least one photodiode included in a plurality of photodiodes and may further include circuitry, control lines, and the like associated with the at least one photodiode. In some embodiments the at least one photodiode, circuitry, control lines are all located on or in a common substrate (e.g., the sensor wafer 101). In the same or other embodiments, circuitry and control lines may be distributed across multiple substrates (e.g., the sensor wafer 101 and the logic wafer 151). Furthermore, it is appreciated that the circuit diagrams illustrated in FIG. 1D does not necessarily connote specific physical position of elements within or on the sensor wafer 101 and/or the logic wafer 151.

As illustrated in FIG. 1D, the pixel 105-N includes photodiode 104-N (e.g., a pinned photodiode), transfer transistor TX including transfer gate 112, floating diffusion region 114, reset transistor $RST_1$ including first reset gate 116, source-follower transistor $SF_1$, and selection transistor SEL including select gate 118, each disposed in, on, or otherwise included in the sensor wafer 101. The pixel circuitry 153-N associated with the pixel 105-N includes current source 122 including a transistor CS and a transistor CSW, second reset transistor $RST_2$ including second reset gate 128, reset storage transistor $SSW_R$ including reset storage gate 130, reset storage capacitor $C_R$, storage transistor $SSW_S$ including storage gate 132, storage capacitor $C_S$, row select transistor RS including row select gate 134, and second source-follower transistor $SF_2$, each disposed in, on, or otherwise included in the logic wafer 151. As illustrated, the reset storage transistor $SSW_R$, the reset storage gate 130, the reset storage capacitor $C_R$, the storage transistor $SSW_S$, the storage gate 132, and the storage capacitor $C_S$ included in the pixel circuitry 153-N form a storage node at 124 associated with the pixel 105-N. It is noted that the sensor wafer 101 can be coupled to the logic wafer 151 on a per-pixel basis via a plurality of interconnects including interconnect 120 (a hybrid bonding pad, through-silicon via, or other suitable circuit coupling technology). In other words, each pixel included in the plurality of pixels (e.g., an individual one of the plurality of pixels 105 illustrated in FIG. 1A such as pixel 153-N illustrated in FIG. 1D) is individually coupled to associated pixel circuitry (e.g., a portion of pixel circuitry 153 illustrated in FIG. 1A associated with the individual one of the plurality of pixels 105 such as pixel circuitry 153-N illustrated in FIG. 1D) via one or more corresponding interconnects (e.g., interconnect 120 illustrated in FIG. 1D). The circuitry of pixel 105-N included in the sensor wafer 101 is electrically coupled to the pixel circuitry 153-N via the interconnect 120.

As illustrated, the transfer transistor TX is coupled between the photodiode 104-N and the floating diffusion region 114. The floating diffusion region 114 is coupled between the transfer transistor TX, the reset transistor $RST_1$, and the source-follower transistor $SF_1$. The source-follower transistor $SF_1$ is coupled between the floating diffusion region 114 and the selection transistor SEL. The floating diffusion region 114 is coupled to the gate of the source-follower transistor $SF_1$. The interconnect 120 is coupled between the floating diffusion region 114 and the storage node 124 (e.g., indirectly via the source-follower transistor $SF_1$ and the selection transistor SEL). The storage node 124 is further coupled between the interconnect 120 and second source-follower transistor $SF_2$. The reset storage transistor $SSW_R$ is coupled between the reset storage capacitor $C_R$ and the second reset transistor $RST_2$. The storage capacitor $SSW_s$ is coupled between the storage capacitor $C_S$ and the second reset transistor $RST_2$. The second source-follower transistor $SF_2$ is coupled between the row select transistor RS and the storage node 124. The row select transistor RS is coupled between the bitline and the storage node 124.

It is appreciated that in the illustrated embodiment, the gate terminal (e.g., transfer gate 112, first reset gate 116, select gate 118, second reset gate 128, unlabeled gate for transistor $C_S$, unlabeled gate for transistor CSW, reset storage gate 130, storage gate 132, and row select gate 134) for each transistor (e.g., transfer transistor TX, reset transistor $RST_1$, selection transistor SEL, transistor $C_S$, transistor CSW, reset storage transistor $SSW_R$, storage transistor $SSW_s$, and row select transistor RS) may be coupled to one or more control lines (see, e.g., FIG. 1E and FIG. 1F), for controlling operation of the imaging system 100. Specifically, the control lines may be coupled to a controller, control circuitry (see, e.g., control circuit 161 illustrated in FIG. 1A), or other circuitry not explicitly illustrated to control operation of the imaging system 100. In some embodiments, common elements along a common row may share control lines. In the same or other embodiments, certain elements may be configured to have individual control lines to provide selective readout in accordance with embodiments of the disclosure.

In some embodiments, each pixel included in the plurality of pixels 105 illustrated in FIG. 1A has corresponding pixel circuitry illustrated in FIG. 1D. Thus, each pixel included in the plurality of pixels 105 is associated with an individual storage node (e.g., storage node 124 illustrated in FIG. 1D associated with an individual one of the plurality of pixels 105 corresponding to pixel 105-N) included in a plurality of storage nodes (not illustrated but included in the pixel circuitry 153 illustrated in FIG. 1A). Accordingly, the logic wafer 151 includes a plurality of storage capacitors (e.g., at least one of storage capacitors $C_S$ for each pixel included in the plurality of pixels 105), each associated with a respective one of the plurality of pixels 105 of the sensor wafer 101. The plurality of storage capacitors includes a first storage capacitor associated with the first pixel and a second storage capacitor associated with the second pixel (e.g., a first storage capacitor and a second storage capacitor included in the plurality of storage capacitors are respectively associated with or otherwise electrically coupled to a corresponding pixel included in the plurality of pixels 105 such as pixel 105-1 and 105-2 illustrated in FIG. 1B). Similarly, the logic wafer 151 includes a plurality of reset storage capacitors (e.g., at least one of reset storage capacitors $C_R$ for each pixel included in the plurality of pixels 105), each associated with a respective one of the plurality of pixels 105 of the sensor wafer 101. The plurality of reset storage capacitors includes a first reset storage capacitor associated with a first pixel (e.g., pixel 105-1 illustrated in FIG. 1B) and a second reset storage capacitor associated with a second pixel (e.g., pixel 105-2 illustrated in FIG. 1B).

During operation to capture a given image frame (e.g., a first image frame included in a plurality of image frames) representative of an external scene, image charge accumulated by photodiode 104-N during an exposure period (e.g., a short exposure period, a long exposure period, or otherwise) associated with the given image frame may be transferred to floating diffusion region 114 in response to a transfer signal applied (e.g., asserted) to transfer gate 112 (e.g., via a transfer control line) to turn on the transfer transistor TX. In some embodiments, the transfer signal may cause image charge accumulated in each of the plurality of photodiodes 104 to simultaneously be transferred to respective floating diffusion regions associated with the plurality of pixels 105. The source-follower transistor $SF_1$ is coupled to the photodiode 104-N to generate an image signal (e.g., a long exposure image signal, a short exposure image signal, or otherwise depending on the exposure period associated with the given image frame that is being readout) in response to the image charge accumulated by the photodiode 104-N during the exposure period (e.g., long exposure period, short exposure period, or other exposure period). In the illustrated embodiment, the image signal is readout to the storage node 124, or more specifically, the corresponding storage capacitor $C_S$ via the storage transistor $SSW_s$. In the same or other embodiments, the reset transistor $RST_1$ may be utilized to reset the charge in the floating diffusion region 114 and, optionally, the charge in the photodiode 104-N(e.g., to VDD or another appropriate predetermined potential). During reset, a reset signal (e.g., a long exposure reset signal, a short exposure reset signal, or otherwise depending on the exposure period associated with the given image frame that is being readout) may be readout and stored in the corresponding reset storage capacitor $C_R$. In some embodiments, the reset signal may be subtracted from the image signal (e.g., correlated double sampling) for each pixel included in the plurality of pixels 105 to generate image data corresponding to or otherwise representative of the image frame. In the same or other embodiments, the current source 122 in combination with the reset transistor $RST_2$ may be utilized to reset the capacitors (e.g., reset storage capacitor $C_R$ and/or storage capacitor $C_S$) to a pre-determined value. The row select transistor may be utilized (e.g., via a row select signal applied to row select gate 134) to readout the image signal and reset signal on a row-by-row basis to column circuitry (e.g., via bitline to column circuits 155 illustrated in FIG. 1A) to generate the image data. It is appreciated that additional details related to the operation of the imaging system 100 have been omitted, which will be discussed in greater detail in subsequent sections.

Figure 1E:
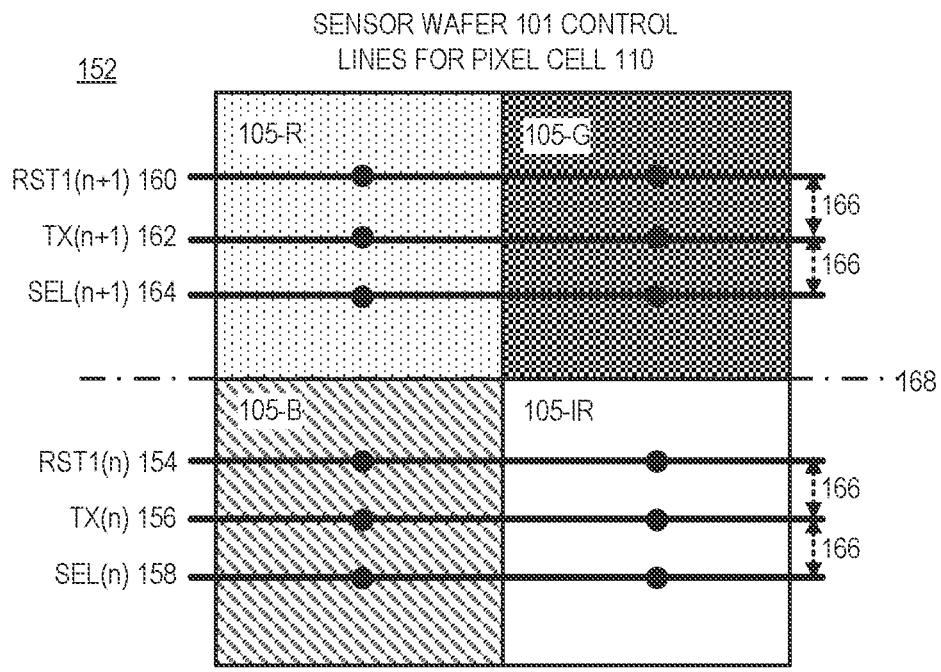
FIG. 1E illustrates an example pixel control line arrangement of the sensor wafer illustrated in FIG. 1A, in accordance with the teachings of the present disclosure.

FIG. 1E illustrates an example pixel control line arrangement 152 for a pixel cell (e.g., the pixel cell 110) of the sensor wafer 101 illustrated in FIG. 1A, in accordance with the teachings of the present disclosure. As discussed previously, the illustrated pixel cell 110 includes red (105-R), green (105-G), blue (105-B), and infrared (105-IR) pixels included in the plurality of pixels 105, each pixel with corresponding circuitry as illustrated in FIG. 1D. As illustrated the blue pixel 105-B (e.g., the first pixel) and the infrared pixel 105-IR (e.g., the second pixel) are arranged on row "n" (e.g., a first row). The red pixel 105-R (e.g., the third pixel) and the green pixel 105-G (e.g., the fourth pixel) are arranged on row "n+1" (e.g., a second row) different from row "n." It is appreciated that the first row and the second row are adjacent to one another (e.g., there is no intervening row between the first row and the second row). Each pixel included in the pixel cell 110 has their own respective instance of circuitry on the sensor wafer 101 (see, e.g., FIG. 1D), which is controlled by a respective control line having an appropriately labeled name. As illustrated in FIG. 1E, the control line arrangement 152 includes first reset control line RST1(*n*) 154, first transfer control line TX(n) 156, first selection control line SEL(n) 158, second reset control line RST1(*n*+1) 160, second transfer control line TX(n+1) 162, and second selection control line SEL(n+1) 164. The general format of the control line names illustrated in FIG. 1E indicate the coupled gate followed by associated row. For example, the label "TX(n)" of the control line TX(n) 156 indicates that the control line TX(n) 156 could be coupled to the transfer gate (e.g., transfer gate 112 illustrated in FIG. 1D) for each pixel associated with row n, the label "RST1(*n*) of the first reset control line RST1(*n*) 154 indicates the first reset control line RST1(*n*) 154 could be coupled to the first reset gate (e.g., first reset gate 116 illustrated in FIG. 1D) for each pixel associated with the row n, and so on. The connection nodes represented by a darkened circle indicate a connection with a named circuit element associated with a corresponding pixel. For example, if there is a connection node on the control line TX(n) 156 over one or more pixels (e.g., 105-B and 105-IR as illustrated in FIG. 1E), then the control line TX(n) 156 is coupled to the transfer gate of each of the one or more pixels (i.e., the transfer gate 112 of both pixels 105-B and 105-R). It is appreciated that when a connection node is omitted when a corresponding control line passes over an associated pixel, then the corresponding control line is not coupled to the named circuit element.

Accordingly, in the illustrated embodiment, the first reset control line RST1(*n*) 154 is electrically coupled to the first reset gate 116 of the reset transistor RST₁ included in each of the first pixel 105-B and the second pixel 105-IR. Also positioned along row n (e.g., the first row) is the first transfer control line TX(n) 156 and the first selection control line SEL(n) 158, which are each coupled to the respective transfer gate (e.g., transfer gate 112 illustrated in FIG. 1D) of a transfer transistor (e.g., transfer transistor TX illustrated in FIG. 1D) and select gate (e.g., select gate 118 illustrated in FIG. 1D) of a selection transistor (e.g., selection transistor SEL illustrated in FIG. 1D) for pixel 105-B (e.g., the first pixel), pixel 105-IR (e.g., the second pixel), and optionally additional pixels (not illustrated) that may be included in row n. In other words, the first transfer control line TX(n) 156 is associated with row n (e.g., the first row) and the first transfer control line TX(n) 156 is coupled to both a first transfer gate of the first pixel and a second transfer gate of the second pixel (e.g., the transfer gate 112 illustrated in FIG. 1D for both pixel 105-B and 105-IR).

Similarly, row n+1 (e.g., the second row), which includes the third pixel 105-R, the fourth pixel 105-G, and optionally additional pixels (not illustrated) includes the second reset control line RST1 160(*n*+1), the second transfer control line TX(n+1) 162, and the second selection control line SEL(n+1) 164, each coupling a respective gate (e.g., transfer gate, first reset gate, and selection gate such as transfer gate 112, first reset gate 116, and selection gate 118 illustrated in FIG. 1D) for each pixel included in row n+1 (e.g., the third pixel 105-R, the fourth pixel 105-G, and optionally additional pixels not illustrated in FIG. 1E).

In some embodiments, adjacent control lines included in each set of control lines associated with a given row (e.g., first reset control line RST1(*n*) 154, first transfer control line TX(n) 156, and first selection control line SEL(n) 158, which are each associated with row n) may be separated from one another by a common separation distance (e.g., separation distance 166 illustrated in FIG. 1E). In the same or other embodiments, control lines of adjacent rows (e.g., row n and row n+1) may be symmetrical about axis 168 (e.g., a first sensor wafer group of control lines including the first reset control line RST1(*n*) 154, first transfer control line TX(n) 156, and first selection control line SEL(n) 158 of row n are symmetric with a second sensor wafer group of control lines including the second reset control line RST1(*n*+1) 160, the second transfer control line TX(n+1) 162, and the second selection control line SEL(n+1) 164 of row n+1 about the axis 168). It is appreciated that in the illustrated embodiment, the connection nodes are aligned across a common column. However, in other embodiments, the connection nodes may not be aligned across a common column.

Figure 1F:
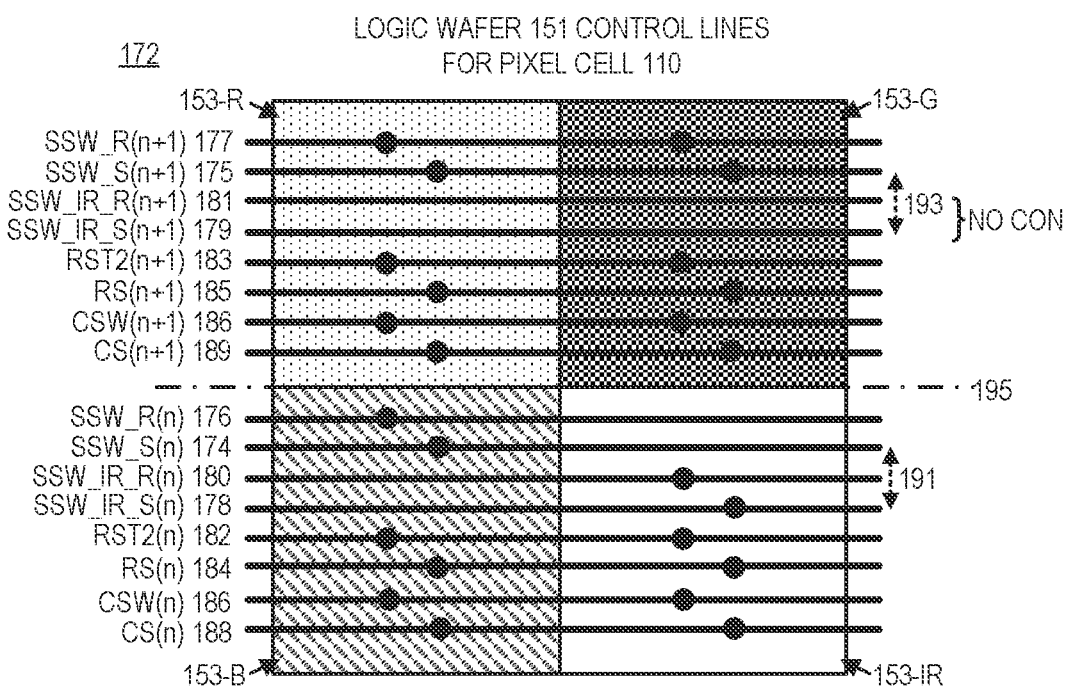
FIG. 1F illustrates an example pixel control line arrangement of the logic wafer illustrated in FIG. 1A, in accordance with the teachings of the present disclosure.

FIG. 1F illustrates an example pixel control line arrangement 172 for pixel circuitry (e.g., pixel circuitry 153-N) on the logic wafer 151 that is associated with a pixel cell (e.g., the pixel cell 110) illustrated in FIG. 1A, in accordance with the teachings of the present disclosure. More specifically, the illustrated control lines of FIG. 1F complements the control lines illustrated in FIG. 1E, which are coupled to control circuitry (e.g., control circuitry 161 illustrated in FIG. 1A), column circuitry (e.g., column circuits 155 illustrated in FIG. 1A), and/or other circuitry to control operation of the pixel cell (e.g., pixel cell 110), or more specifically, the imaging system 100 illustrated in FIG. 1A. As discussed previously, the pixel cell 110 includes red (105-R), green (105-G), blue (105-B), and infrared (105-IR) pixels. Each pixel included in the pixel cell 110 has their own respective instances of circuitry on the sensor wafer 101 and the logic wafer 151 as illustrated in FIG. 1D. Thus, referring back to FIG. 1F, instances of the pixel circuitry 153-N for the pixel cell 110 are respectively labeled 153-R, 153-G, 153-B, and 153-IR. Thus, for pixel cell 110, pixel circuitry 153-R of the logic wafer 151 is associated with pixel 105-R of the sensor wafer 101, pixel circuitry 153-G of the logic wafer 151 is associated with the pixel 105-G of the sensor wafer 101, pixel circuitry 153-B of the logic wafer 151 is associated with pixel 105-B, and pixel circuitry 153-IR is associated with pixel 105-IR.

As illustrated in FIG. 1F, the control line arrangement 172 includes first storage control line SSW_S(n) 174, second storage control line SSW_IR_S(n) 178, first reset storage control line SSW_R(n) 176, second reset storage control line SSW_IR_R(n) 180, second reset control line RST$_2$(n) 182, row select control line RS(n) 184, control line CSW(n) 186, control line C$_S$(n) 188, each associated with row n (e.g., the first row). Similarly, for row n+1 (e.g., the second row), there is third storage control line SSW_S(n+1) 175, third reset storage line SSW_R(n+1) 177, control line SSW_IR_S (n+1) 179, control line SSW_IR_R(n+1) 181, second reset control line RST$_2$(n+1) 183, row select control line RS(n+1) 185, control line CSW(n+1) 186, and control line C$_S$(n+1) 189.

The general format of the control line names illustrated in FIG. 1F is similar to that of FIG. 1E, in which the name indicates the coupled gate followed by the associated row. For example, the label "SSW_R(n)" of the first reset storage control line SSW_R(n) 176 indicates that the first reset storage control line SSW_R(n) 176 could be coupled to the reset storage gate (e.g., reset storage gate 130 illustrated in FIG. 1D) for each pixel associated with row n, the label "SSW_S(n)" of the first storage control line SSW_S(n) 174 indicates the first storage control line SSW_S(n) 174 could be coupled to the first storage gate (e.g., first storage gate 132 illustrated in FIG. 1D) for each pixel associated with the row n, and so on. The connection nodes represented by a darkened circle indicate a connection with a named circuit element associated with a corresponding pixel. For example, if there is a connection node on the first storage control line SSW_S(n) 174 over the pixel circuitry for one or more pixels (e.g., 153-B as illustrated in FIG. 1F), then the first storage control line SSW_S(n) 174 is coupled to the storage gate included in the pixel circuitry for each of the one or more pixels. It is appreciated that when a connection node is omitted when a corresponding control line passes over an associated pixel, then the corresponding control line is not coupled to the named circuit element.

It is appreciated that one way the control line arrangement 172 illustrated in FIG. 1F is different from the control line arrangement 152 illustrated in FIG. 1E, is that FIG. 1F includes additional control lines to provide selective readout to aid in the operation of capturing visible-infrared image frames with multiple exposure periods. Specifically, since infrared data from a short exposure period will be utilized in combination with color image data from a long exposure period to generate an image frame, rows containing both visible pixels (e.g., 105-B illustrated in FIG. 1A or other color pixels such as 105-G or 105-R in embodiments with a different color filter arrangement) and non-visible pixels (e.g., infrared pixels such as 105-IR illustrated in FIG. 1A) contain additional control lines to provide selective readout between color pixels and non-visible pixels (e.g., row n). To maintain control line symmetry and reduce or otherwise mitigate noise during readout, dummy control lines not coupled to any pixels are also included in rows that do not contain non-visible pixels (e.g., row n+1).

Accordingly, in the illustrated embodiment, first reset storage control line SSW_R(n) 176 is coupled to the reset storage gate included in the pixel circuitry for each visible pixel (e.g., the pixel circuitry 153-B for pixel 105-B) in row n while second reset storage control line SSW_IR_R(n) 180 is coupled to the reset storage gate included in the pixel circuitry for each non-visible pixel (e.g., the pixel circuitry 153-IR for pixel 105-IR). Similarly, first storage control line SSW_S(n) 174 is coupled to the storage gate included in the pixel circuitry for each visible pixel (e.g., the pixel circuitry 153-B for pixel 105-B) in row n while second storage control line SSW_IR_S(n) 178 is coupled to the storage gate included in the pixel circuitry for each non-visible pixel (e.g., the pixel circuitry 153-IR for pixel 105-IR) in row n.

It is noted that in the illustrated embodiment, row n+1 is not associated with any non-visible pixels. Thus, third storage control line SSW_S(n+1) 175 and third reset storage line SSW_R(n+1) 177 are respectively coupled to the storage gate and the reset gate included in the pixel circuitry of each visible pixel included in the row n+1 (e.g., the pixel circuitry 153-R and 153-G). To maintain control line symmetry and mitigate noise during readout, control line SSW_IR_S(n+1) 179 and control line SSW_IR_R(n+1) 181 are present for row n+1, but no connection to the pixel circuitry of pixels associated with row n+1 is made, which is represented by the lack of connection nodes along said control lines. In other words, control line SSW_IR_S(n+1) 179 and control line SSW_IR_R(n+1) 181 are dummy control lines. In particular, control line SSW_IR_S(n+1) 179 corresponds to a dummy storage control line and control line SSW_IR_R (n+1) 181 corresponds to a dummy reset storage control line.

The following details then describe the overall relationship between the control lines of FIG. 1F when viewed in context of the pixel circuitry 153-B, 153-IR, 153-R, and 153-G as being represented by different instances of the pixel circuitry 153-N illustrated in FIG. 1D. The first storage control line SSW_S(n) 174 is coupled to a first storage gate associated with the first pixel (e.g., the storage gate 132 included in the pixel circuitry 153-B, which is associated with the pixel 105-B). The first storage gate (e.g., the storage gate 132 included in the pixel circuitry 153-B) is included in a first storage transistor (e.g., storage transistor SSW$_s$ included in the pixel circuitry 153-B) coupled to a first storage capacitor (e.g., storage capacitor C$_S$ included in the pixel circuitry 153-B). The second storage control line SSW_IR_S(n) 178 is coupled to a second storage gate associated with the second pixel (e.g., the storage gate 132 included in the pixel circuitry 153-IR, which is associated with the pixel 105-IR). The second storage gate (e.g., the storage gate 132 included in the pixel circuitry 153-IR) is included in a second storage transistor (e.g., storage transistor SSW$_s$ included in the pixel circuitry 153-IR) coupled to the second storage capacitor (e.g., storage capacitor C$_S$ included in the pixel circuitry 153-IR). As illustrated in FIG. 1F, first storage control line SSW_S(n) 174 is separate from the second storage control line SSW_IR_S(n) 178 to provide selective readout to at least one of the first storage capacitor (e.g., storage capacitor C$_S$ included in the pixel circuitry 153-B) or the second storage capacitor (e.g., storage capacitor C$_S$ included in the pixel circuitry 153-IR). The logic wafer 151 further includes the third storage control line SSW_S(n+1) 175 coupled to both a third storage gate associated with the third pixel (e.g., the storage gate 132 included in the pixel circuitry 153-R, which is associated with the pixel 105-R) and a fourth storage gate associated with the fourth pixel (e.g., the storage gate 132 included in the pixel circuitry 153-G, which is associated with the pixel 105-G). The third storage gate (e.g., the storage gate 132 included in the pixel circuitry 153-R) is included in a third storage transistor (e.g., storage transistor SSW$_s$ included in the pixel circuitry 153-R) coupled to the third storage capacitor (e.g., storage capacitor C$_S$ included in the pixel circuitry 153-R). The fourth storage gate (e.g., the storage gate 132 included in the pixel circuitry 153-G) is included in a fourth storage transistor (e.g., storage transistor SSW$_S$ included in the pixel circuitry 153-G) coupled to the fourth storage capacitor (e.g., storage capacitor C$_S$ included in the pixel circuitry 153-G). The logic wafer 151 further includes a dummy storage control line (e.g., control line SSW_IR_S (n+1) 179) positioned proximate to the third storage control line SSW_S(n+1) 175. As illustrated, the dummy storage control line (e.g., control line SSW_IR_S(n+1) 179) is not connected to any gate, including the first storage gate, the second storage gate, the third storage gate, and the fourth storage gate, associated with the first pixel, the second pixel, the third pixel, and the fourth pixel. In the illustrated embodiment of FIG. 1F, the dummy storage control line (e.g., control line SSW_IR_S(n+1) 179) is positioned to maintain control line symmetry of the logic wafer 151 such that a first separation distance 191 between the first storage control line SSW_S(n) 174 and the second storage control line SSW_IR_S(n) 178 is equal to a second separation distance 193 between the third storage control line SSW_S(n+1) 175 and the dummy storage control line (e.g., control line SSW_IR_S(n+1) 179).

It is appreciated that the dummy control lines (e.g., dummy storage control line SSW_IR_S(n+1) 179, dummy storage reset control line SSW_IR_R(n+1) 181, or other dummy control lines described in various embodiments of the present disclosure) may be biased to a pre-determined value (e.g., a pre-set voltage level). In some embodiments, the pre-determined value of the bias corresponds to a logic low (e.g., ground or a negative bias voltage such as −1.4V) of one or more nearby control lines. In some embodiments, the pre-determined value applied to the dummy control lines corresponds to a logic low of an adjacent control line (i.e., not one of the dummy control lines). For example, the pre-determined value of the bias applied to dummy storage control line SSW_IR_S(n+1) 179 and/or dummy storage reset control line SSW_IR_R(n+1) 181 may correspond to the logic low value for control line SSW_S(n+1) 175 and/or third reset storage line SSW_R(n+1) 177 to provide both physical and electrical symmetric (e.g., when the active control lines are at a logic low).

In the illustrated embodiment, the logic wafer 151 control lines for pixel cell 110 further includes the reset storage control line SSW_R(n) 176, which is coupled to a first reset storage gate associated with the first pixel (e.g., the reset storage gate 130 included in the pixel circuitry 153-B, which is associated with the pixel 105-B). The first reset storage gate (e.g., the reset storage gate 130 included in the pixel circuitry 153-B) is included in a first reset storage transistor (e.g., storage transistor $SSW_R$ included in the pixel circuitry 153-B) coupled to the first reset storage capacitor (e.g., reset storage capacitor $C_R$ included in the pixel circuitry 153-B). The second reset storage control line SSW_IR_R(n) 180 is coupled to a second storage gate associated with the second pixel (e.g., the reset storage gate 130 included in the pixel circuitry 153-IR, which is associated with the pixel 105-IR). The second reset storage gate (e.g., the reset storage gate 130 included in the pixel circuitry 153-IR) is included in a second storage transistor (e.g., reset storage transistor $SSW_R$ included in the pixel circuitry 153-IR) coupled to the second reset storage capacitor (e.g., reset storage capacitor $C_R$ included in the pixel circuitry 153-IR). As illustrated in FIG. 1F, first reset storage control line SSW_R(n) 176 is separate from the second reset storage control line SSW_IR_R(n) 180 to provide selective readout to at least one of the first reset storage capacitor (e.g., reset storage capacitor $C_R$ included in the pixel circuitry 153-B) or the second reset storage capacitor (e.g., storage capacitor $C_R$ included in the pixel circuitry 153-IR).

In the same or other embodiments, control lines for the logic wafer 151 associated with adjacent rows (e.g., row n and row n+1) may be symmetrical about axis 195 (e.g., a first logic wafer group of control lines including first storage control line SSW_S(n) 174, second storage control line SSW_IR_S(n) 178, first reset storage control line SSW_R(n) 176, second reset storage control line SSW_IR_R(n+1) 180 of row n are symmetric with a second logic wafer group of control lines including the third storage control line SSW_S(n+1) 175, third reset storage line SSW_R(n+1) 177, control line SSW_IR_S(n+1) 179, control line SSW_IR_R(n+1) 181 of row n+1 about the axis 195). It is appreciated that in the illustrated embodiment, the connection nodes are aligned across a common column. However, in other embodiments, the connection nodes may not be aligned across a common column.

The control line arrangement 152 of FIG. 1E and the control line arrangement 172 of FIG. 1F only illustrates individual pixel cell 110, which may be one of many pixel cells included in a plurality of pixel cells (e.g., as illustrated in FIG. 1A). Accordingly, it is appreciated that there may be additional pixels and associated pixel circuitry included in row n and row n+1. In other words, there may be more than two columns in some embodiments of the disclosure. Additionally, there may be additional rows above and/or below the pixel cell 110 (e.g., as illustrated in FIG. 1A). Thus, the specific number of pixel cells, rows, and/or columns explicitly illustrated is not intended to be limiting and that there may be any number of pixel cells, rows, and/or columns included in the various embodiments of the disclosure. Furthermore, it is appreciated that different color filter patterns or arrangements may be utilized (e.g., the infrared pixels may be adjacent to any of red, green, or blue pixels, or other visible pixels). However, in most embodiments, it is appreciated that control line symmetry may be maintained to provide the advantages discussed herein.

Figure 2A:
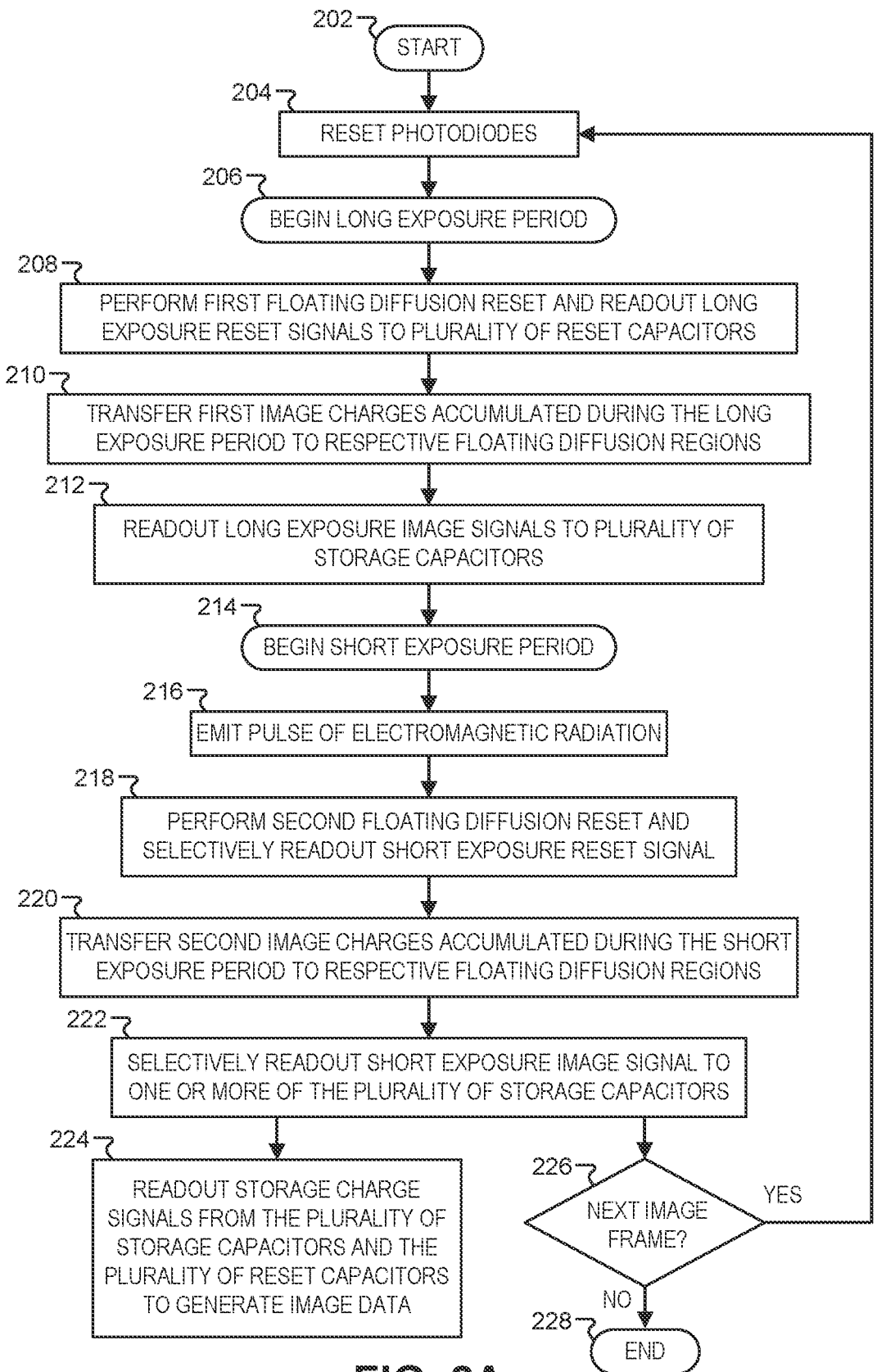
FIG. 2A illustrates an example method of operation for an imaging system with selective readout for visible-infrared image capture, in accordance with the teachings of the present disclosure.

FIG. 2A illustrates an example method 200 of operation for an imaging system with selective readout for visible-infrared image capture, in accordance with the teachings of the present disclosure. The method 200 may include blocks 202, 204, 206, 208, 210, 212, 214, 216, 218, 220, 222, 224, 226, and 228. It is appreciated that the number blocks of method 200 including blocks 202-228, may occur in any order and even in parallel. Additionally, blocks may be added to, or removed from, method 200 in accordance with the teachings of the present disclosure. It is appreciated that method 200 represents one possible implementation for operating an imaging system (e.g., imaging system 100 illustrated in FIGS. 1A-1F). Additionally, it is appreciated that method 200 is not limited to only the imaging system illustrated in FIG. 1A-1F, but rather the method 200 may be applicable for controlling operation of other embodiments of imaging systems and/or image sensors. As illustrated in FIG. 2A, each cycle of the method 200 (e.g., a group of blocks 204-224) may represent capture of an individual image frame representative of an external scene. It is appreciated that a plurality of image frames (e.g., a first image frame, a second image frame, and so on) may be captured to generate a video of the external scene.

During the method 200, selective readout is utilized to capture an image frame with multiple exposure periods. Specifically, a first image frame includes a long exposure period and a short exposure period. A duration of the short exposure period (i.e., a short exposure duration) is less than a duration of the long exposure period (i.e., a long exposure duration). In some embodiments, the short exposure period is configured to occur after the long exposure period. In some embodiments, the short exposure period is utilized to generate non-visible (e.g., near-infrared, infrared, or far-infrared) image data of an external or object scene while the long exposure period is utilized to generate visible (e.g., red, green, blue, or other combination to represent the visible range of the electromagnetic spectrum) image data of the external scene.

Block 202 illustrates a start or initiation of method 200 in which capture of one or more image frames with multiple exposure durations is to occur (e.g., one or more image frames that utilize both visible and infrared image signals to image an external scene). Initiation may occur in response to a user input (e.g., a user depressing or otherwise contacting a physical or virtual trigger), an event condition triggering (e.g., a vehicle transitioning to reverse, a turn signal being activated), or otherwise.

Block 204 shows resetting a plurality of photodiodes (e.g., the plurality of photodiodes 104 included in the plurality of pixels 105 illustrated in FIG. 1A-1F). The plurality of photodiodes may be reset in response to the assertion of a reset signal (e.g., a pulse applied to both transfer gate 112 of the transfer transistor TX and the reset gate 116 of the reset transistor $RST_1$ as illustrated in FIG. 1D for each pixel included in the plurality of pixels 105 of the imaging system 100 illustrated in FIG. 1A). The appropriate signal results in a charge being placed across the plurality of photodiodes to provide a predetermined potential (e.g., VDD illustrated in FIG. 1D or other appropriate predetermined potential) and allow accumulation of image charge during a long exposure period. The reset signal may be applied via the appropriate control lines (e.g., RST1(n) 154, RST1(n+1) 160, TX(n) 156, and TX(n+1) 162 as illustrated in FIG. 1E to turn ON the reset transistor $RST_1$ and transfer transistor TX).

Block 206 illustrates beginning the long exposure period for the image frame. During the long exposure period image charge is accumulated in the plurality of photodiodes in response to incident light from the external scene (e.g., from block 204). The accumulated image charges are representative of the external scene and have a magnitude based on an intensity of light incident on a given photodiode included in the plurality of photodiodes.

Block 208 shows performing a first floating diffusion reset of the image frame (e.g., the first image frame) by resetting the respective floating diffusion regions (e.g., the floating diffusion region 114 illustrated in FIG. 1D) for each pixel included in the plurality of pixels (e.g., the plurality of pixels 105 illustrated in FIGS. 1A-1F), including the first pixel, the second pixel, the third pixel, and the fourth pixel (e.g., pixel 105-B, pixel 105-IR, pixel 105-R, and pixel 105-G illustrated in FIG. 1C-1F). The first floating diffusion reset may be initiated by asserting or otherwise applying a pulse to a reset gate (e.g., the first reset gate 116 of the reset transistor $RST_1$ illustrated in FIG. 1D) for each pixel included in the plurality of pixels, which in turn may activate (e.g., turn ON) a source-follower transistor (e.g., source-follower transistor $SF_1$ illustrated in FIG. 1D) to allow for readout of long exposure reset signals (e.g., the reset level of the floating diffusion region 114 illustrated in FIG. 1D) for each of the plurality of pixels. The pulse to the reset gate for each pixel may be applied via the appropriate control line (e.g., RST1(n) 154 and RST1(n+1) 160 illustrated in FIG. 1E). Consequently, in response to the first floating diffusion reset and with an appropriate configuration (e.g., selection signal applied to select gate 118 to turn ON selection transistor SEL (e.g., first selection control line SEL(n) 158, second selection control line SEL(n+1) 164 to turn corresponding selection transistor SEL), long exposure reset signals from the respective floating diffusion regions (e.g., the floating diffusion region 114 illustrated in FIG. 1D for each pixel included in the plurality of pixels) is readout to a reset storage capacitor associated with each of the plurality of pixels (e.g., a first reset storage capacitor associated with the first pixel, a second reset storage capacitor associated with the second pixel, a third reset storage capacitor associated with the third pixel, a fourth reset storage capacitor associated with the fourth pixel, and so on). In some embodiments, the reset storage capacitor is part of a storage node included in pixel circuitry on a logic wafer (e.g., reset storage capacitor $C_R$ included in storage node 124 illustrated in FIG. 1D). In some embodiments, readout of the long exposure reset signal is facilitated by asserting a signal (e.g., via first selection control line SEL(n) 158, second selection control line SEL(n+1) 164, control line SSW_R(n) 176, control line SSW_IR_R(n) 178, control line SSW_R(n+1) 177, and so on) on a reset storage gate (e.g., reset storage gate 130 of reset storage transistor $SSW_R$ illustrated in FIG. 1D) for each pixel included in the plurality of pixels.

Block 210 illustrates transferring first image charges accumulated during the long exposure period of the image frame (e.g., the first image frame) to respective floating diffusion regions the plurality of pixels (e.g., the floating diffusion region 114 for each of a first pixel such as 105-B, a second pixel such as 105-IR, a third pixel, such as 105-R, a fourth pixel such as 105-G, and so on as illustrated in FIG. 1C-1F). In some embodiments, a transfer control line signal (e.g., a first transfer control line signal) associated with the plurality of pixels (e.g., one or more of the first pixel, the second pixel, the third pixel, the fourth pixel or otherwise) is asserted (e.g., applied to TX(n) 156 and TX(n+1) 162 illustrated in FIG. 1E) to transfer the first image charges accumulated during the long exposure period (e.g., the first image charges accumulated during the long exposure period of the first image frame may be transferred to respective floating diffusion regions one or more of the first pixel, the second pixel, the third pixel, the fourth pixel, and so on). In some embodiments, the transfer control line signal corresponds to a pulse applied to the transfer gate (e.g., transfer gate 112 of transfer transistor TX as illustrated in FIG. 1D) for each of the plurality of pixels. In the same or other embodiments, the transfer control line signal is applied to the transfer gate of each of the plurality of pixels simultaneously. In some embodiments, initiation of block 210 corresponds to a termination of the long exposure period of the image frame being captured (e.g., the first image frame).

Block 212 shows reading out the long exposure image signals from the respective floating diffusion regions to respective storage capacitors (e.g., a first storage capacitor associated with the first pixel and a second storage capacitor associated with the second pixel) included in the storage node for each pixel included in the plurality of pixels (e.g., storage capacitor $C_S$ illustrated in FIG. 1D). More specifically, upon transferring the long exposure image signals to the respective floating diffusion regions (e.g., floating diffusion region 114 illustrated in FIG. 1D), then the corresponding source-follower transistors (e.g., source-follower transistor $SF_1$ illustrated in FIG. 1D) will turn ON and with an appropriate configuration (e.g., selection signal applied to select gate 118 to turn ON selection transistor SEL and storage control line signal applied to storage gate 132 to turn ON storage transistor $SSW_S$ illustrated in FIG. 1D) then charge representative of a magnitude of charge stored within the respective floating diffusion region of the sensor wafer will be stored in the storage capacitor of the logic wafer. In some embodiments, separate control line signals (e.g., a first storage control line signal and a second storage control line signal) will be asserted or otherwise applied simultaneously to the appropriate storage control line (e.g., first storage control line SSW_S(n) 174 and second storage control line SSW_IR_S(n) 178) to turn ON the associated storage transistor (e.g., storage transistor SSW$_S$ illustrated in FIG. 1D) of different pixels oriented along a common row (e.g., the first row including first pixel 105-B and second pixel 105-IR as illustrated in FIG. 1A-1F). In the same or other embodiments an individual storage line control signal will be asserted or otherwise applied to an appropriate control line (e.g., the third storage control line SSW_S(n+1) 175 illustrated in FIG. 1F) coupled to all pixels along a common row (e.g., the second row including third pixel 105-R and fourth pixel 105-G as illustrated in FIG. 1A-1F).

Block 214 illustrates beginning the short exposure period for the image frame. In some embodiments, the short exposure period may begin in response to resetting the plurality of photodiodes. In other words, during block 214 the plurality of photodiodes may be reset (e.g., in the manner described in block 204 illustrated in FIG. 2A). The plurality of photodiodes may accumulate image charges representative of the external scene and have a magnitude based on an intensity of light incident on a given photodiode included in the plurality of photodiodes during the short exposure period.

Block 216 shows emitting a pulse of a first spectrum of electromagnetic radiation during the short exposure period of the image (e.g., the first image frame). The emission of the first spectrum of electromagnetic radiation is synchronized with the short exposure period. It is appreciated that to mitigate crosstalk between the short exposure period of the image frame and the long exposure period of a subsequent image frame, a pulse duration of the pulse is less than the short exposure duration of the short exposure period of the image frame. In some embodiments, the pulse duration of the pulse is more than ten times less than the duration of the long exposure period, which may enable capture of non-visible images during the short exposure period with minimal consequences on the visible images captured during the long exposure period. The short exposure duration of the short exposure period may be configured based on the amount of time required to capture the first spectrum of electromagnetic radiation reflected from the external scene. It is appreciated that the first spectrum of electromagnetic radiation includes a first wavelength, which may be within the infrared range of the electromagnetic spectrum (e.g., from near-infrared to far-infrared such as 800 nm to 3000 nm). The first spectrum of electromagnetic radiation may be generated by a light source, wherein the light source may be a component external to the image sensor. During the short exposure period, the plurality of photodiodes accumulates image charges in response to the pulse of the first spectrum of electromagnetic radiation reflecting off one or more objects in the external scene to be incident upon the plurality of photodiodes, which may be utilized to generate an illuminated image without disturbing human eyes (i.e., a non-visible image based on the pulse of the first spectrum of electromagnetic radiation that is outside of the visible range of light) and/or depth or distance information associated with the external scene (e.g., distance or depth one or more pixels included in the plurality of pixels are from the one or more objects included in the external scene). In some embodiments, time of flight information and/or phase difference information may be computed based on the image charges accumulated during the short exposure period.

Block 218 illustrates performing a second floating diffusion reset of the image frame (e.g., the first image frame) by resetting the respective floating diffusion regions (e.g., the floating diffusion region 114 illustrated in FIG. 1D) for each pixel included in the plurality of pixels (e.g., the plurality of pixels 105 illustrated in FIGS. 1A-1F), including the first pixel, the second pixel, the third pixel, and the fourth pixel (e.g., pixel 105-B, pixel 105-IR, pixel 105-R, and pixel 105-G illustrated in FIG. 1C-1F).

In contrast to block 208 where the long exposure reset signals for each pixel was readout to an associated reset storage capacitor, in block 218 selective readout is performed to preserve a first portion of the long exposure reset signals associated with visible pixels (e.g., 105-B, 105-R, and 105-G of the pixel cell 110 illustrated in FIG. 1A) while a second portion of the long exposure reset signals associated with non-visible pixels (e.g., 105-IR of the pixel cell 110 illustrated in FIG. 1A) is to be replaced with a corresponding short exposure reset signal. For example, in the case of pixel cell 110 illustrated in FIGS. 1A-1F, a short exposure reset signal from the corresponding one of the floating diffusion regions (e.g., floating diffusion region 114 of the pixel 105-IR) is readout to the second reset storage capacitor associated with the second pixel (e.g., the reset storage capacitor $C_R$ of the pixel 105-IR) in response to the second floating diffusion reset. This is achieved, at least in part, applying a pulse (i.e. asserting a signal) to the reset storage gate 130 of the reset storage transistor $SSW_R$ for non-visible pixels (e.g., pixel 105-IR) to turn ON the reset storage transistor $SSW_R$ for non-visible pixels while not turning on the reset storage transistor $SSW_R$ of visible pixels (e.g., 105-B, 105-G, and 105-IR).

Block 220 shows transferring second image charges accumulated during the short exposure period of the image frame (e.g., the first image frame) to the respective floating diffusion regions of the plurality of pixels (e.g., the floating diffusion region 114 for each of the first pixel such as 105-B, the second pixel such as 105-IR, the third pixel, such as 105-R, the fourth pixel such as 105-G, and so on as illustrated in FIG. 1C-1F). In some embodiments, a transfer control line signal (e.g., a first transfer control line signal) associated with the plurality of pixels (e.g., one or more of the first pixel, the second pixel, the third pixel, the fourth pixel or otherwise) is asserted (e.g., applied to TX(n) 156 and TX(n+1) 162 illustrated in FIG. 1E) to transfer the second image charges accumulated during the short exposure period (e.g., the second image charges accumulated during the short exposure period of the first image frame may be transferred to respective floating diffusion regions one or more of the first pixel, the second pixel, the third pixel, the fourth pixel, and so on). In some embodiments, the transfer control line signal corresponds to a pulse applied to the transfer gate (e.g., transfer gate 112 of transfer transistor TX as illustrated in FIG. 1D) for each of the plurality of pixels. In the same or other embodiments, the transfer control line signal is applied to the transfer gate of each of the plurality of pixels simultaneously. In some embodiments, initiation of block 220 corresponds to a termination of the short exposure period of the image frame being captured (e.g., the first image frame).

Block 222 illustrates selectively reading out short exposure image signals from the respective floating diffusion regions to respective storage capacitors (e.g., the second storage capacitor associated with the second pixel when the second pixel corresponds to a non-visible pixel such as pixel 105-IR of pixel cell 110 illustrated in FIG. 1A). More specifically, the short exposure image signals may be readout to the storage capacitor associated with each non-visible pixel (e.g., infrared pixel) to overwrite or otherwise replace the long exposure image signals previously stored (see, e.g., block 212). In contrast, the long exposure image signals associated with visible pixels included in the plurality of pixels are not replaced or otherwise readout to the associated storage capacitors included in the visible pixels. In some embodiments, readout of the short exposure signal is achieved by asserting the appropriate storage control line signal (e.g., asserting the second storage control line signal and not the first storage control line signal to initiate the reading out the short exposure image signal to the second storage capacitor and replace a previous storage signal associated with the long exposure period of the first image frame). In the case of FIG. 1F, for example, this may be achieved by applying a pulse to second storage control line SSW_IR_S(n) 178 (associated with 105-IR illustrated in FIG. 1E), but not first storage control line SSW_S(n) 174 (associated with 105-B illustrated in FIG. 1E) or third storage control line SSW_S(n+1) 175 (associated with 105-R and 105-G illustrated in FIG. 1E).

Block 224 illustrates reading out storage charge signals from the plurality of storage capacitors (e.g., the storage capacitor $C_S$ as illustrated in FIG. 1D for each of the plurality of pixels) and the plurality of reset capacitors (e.g., the reset storage capacitor $C_R$ as illustrated in FIG. 1D for each of the plurality of pixels) to generate image data corresponding to or otherwise representative of the image frame (e.g., the first image frame). It is appreciated that additional processing may be performed to generate the image frame (e.g., demosaicing, smoothing, and the like). In some embodiments, the storage charge signals are readout via column circuits (e.g., column circuits 155 illustrated in FIG. 1A), which may include analog to digital converters, sample and hold circuits, or otherwise to determine a state of each capacitor included in the storage node (e.g., storage node 124 illustrated in FIG. 1D) of each pixel included in the plurality of pixels. Specifically, for a given pixel, the storage capacitor stores a signal level and the reset storage capacitor stores a reset level, which are readout (e.g., via second source-follower transistor $SF_2$ illustrated in FIG. 1D) to the bitline, which in turn goes to column circuits that convert the signal level minus the reset level to a digital value (e.g., image data). For example, in one embodiment, storage charge signals are readout from the first storage capacitor and the second storage capacitor (e.g., the storage capacitor $C_S$ respectively associated with pixel 105-B and 105-IR illustrated in FIG. 1E-1F) to generate at least a portion of the image data for the image frame (e.g., the first image frame), which is based on a corresponding one of the long exposure image signals associated with the first pixel (e.g. pixel 105-B illustrated in FIG. 1A-1F) and the short exposure image signal associated with the second pixel (e.g., pixel 105-IR illustrated in FIG. 1A-1F). In the same or another embodiment, the image data for the first image frame is based on a first difference between the corresponding one of the long exposure image signals associated with the first pixel and a corresponding one of the long exposure reset signals associated with the first pixel and a second difference between the short exposure image signal and the short exposure reset signal. In some embodiments, readout of the storage charge signals is done on a row-by-row basis to generate the image data, which may occur during capture of a next image frame.

If additional image frames are to be captured, then block 226 proceeds back to block 204 and the method 200 continues to capture the next image frame. If additional image frames are not desired, then block 226 proceeds to block 228 and the method 200 ends or otherwise terminates.

Figure 2B:
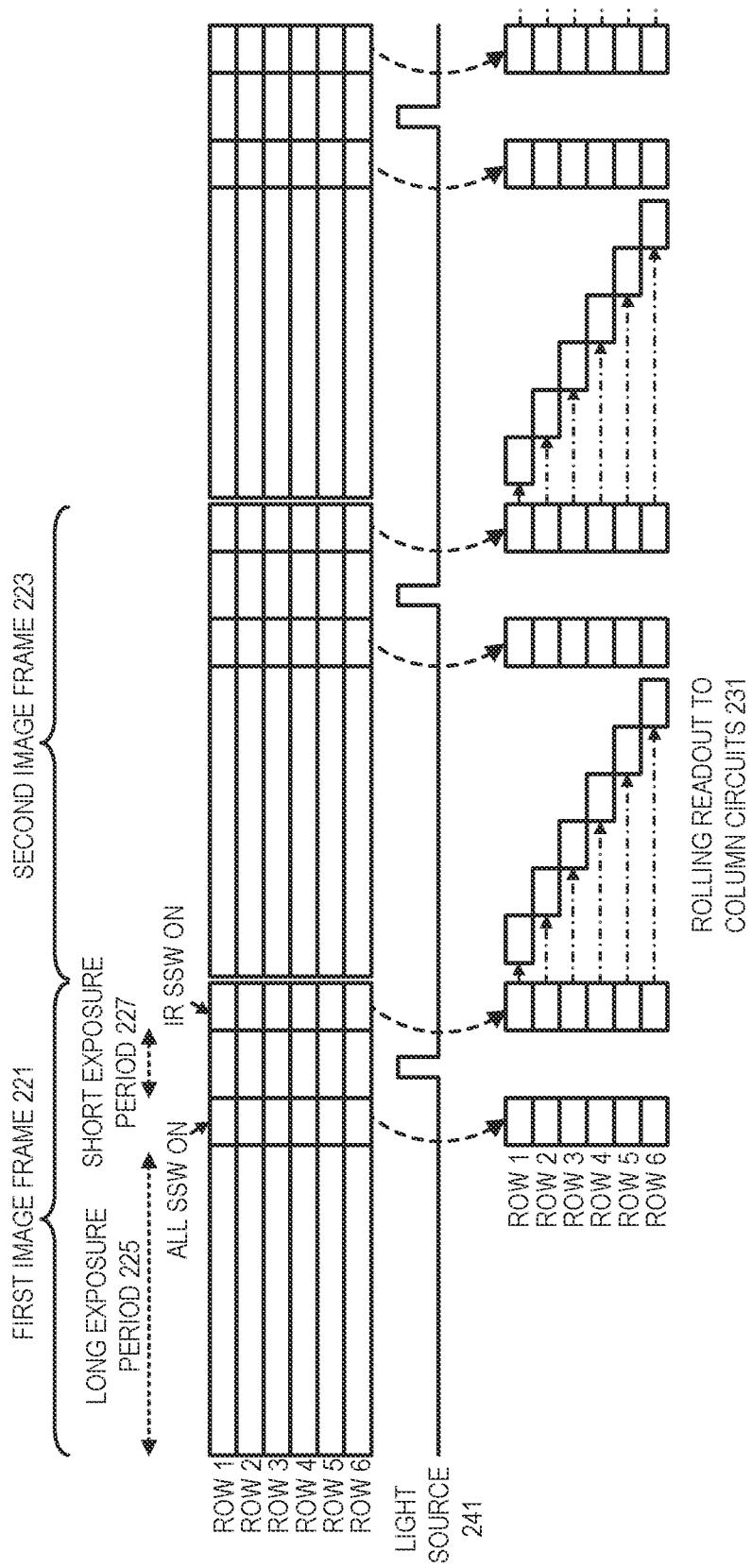
FIG. 2B illustrates an example timing diagram for capturing a visible-infrared image frame via selective readout during a short exposure period and a long exposure period, in accordance with the teachings of the present disclosure.

FIG. 2B illustrates an example timing diagram 250 for capturing an image frame (e.g., first image frame 221 and second image frame 223) representative of an external scene via selective readout during a long exposure period and a short exposure period of the image frame (e.g., long exposure period 225 and short exposure period 227 of the first image frame 227), in accordance with the teachings of the present disclosure. The timing diagram 250 provides a visual representation of an example photodiode exposure and readout from multiple rows of an image sensor or imaging system (e.g., the imaging system 100 illustrated in FIG. 1A and associated structure as illustrated in FIGS. 1A-1F) via the method 200 illustrated in FIG. 2A. As discussed in embodiments previously, the plurality of pixels include visible (e.g., red, green, blue) and non-visible (e.g., infrared) pixels. During the long exposure period 225, the photodiodes (e.g., PD 104-N illustrated in FIG. 1D) accumulates image charge. Then to end the long exposure period, the accumulated image charges are readout to the floating diffusion regions (e.g., corresponding to floating diffusion region 114 illustrated in FIG. 1D). Then all storage switches (e.g., storage transistor $SSW_S$ illustrated in FIG. 1D via applying a pulse to a storage control line such as SSW_S(n) 174, SSW_IR_S(n) 178, and SSW_S(n+1) 175 as illustrated in FIG. 1F, for each pixel included in the plurality of pixels) for both visible and non-visible pixels are turned ON to readout the long exposure image signals to the storage capacitors (e.g., storage capacitor $C_S$, illustrated in FIG. 1D) associated with each of the plurality of pixels. Shortly thereafter, the short exposure period 227 starts, during which light source 241 emits a pulse of electromagnetic radiation (e.g., light having a wavelength between 800 nm to 3000 nm) towards the external scene that the image sensor captures and charge is accumulated in the photodiode of each of the plurality of pixels. Then to end the short exposure period, the accumulated image charges are readout to the floating diffusion regions (e.g., floating diffusion region 114 illustrated in FIG. 1D), but only the storage switches associated with non-visible pixels are activated to readout the short exposure image signals (e.g., storage transistor $SSW_S$ illustrated in FIG. 1D via applying a pulse to a storage control line of non-visible pixels such as SSW_IR_S(n) 178 and not SSW_S(n) 174 as illustrated in FIG. 1F). When reading out the short exposure image signals, each short exposure image signal included in the short exposure image signal replaces a corresponding one of the long exposure image signals (e.g., generated in response to image light reflected from the external scene incident upon the image sensor during the long exposure period 225). Afterwards, the next image frame (e.g., the second image frame 223) begins and rolling readout 231 of the storage charge signals to generate image data of the first image frame 221 is performed. In other words, reading out the storage charge signals is done on a row-by-row basis to generate the image data.

Figure 3A:
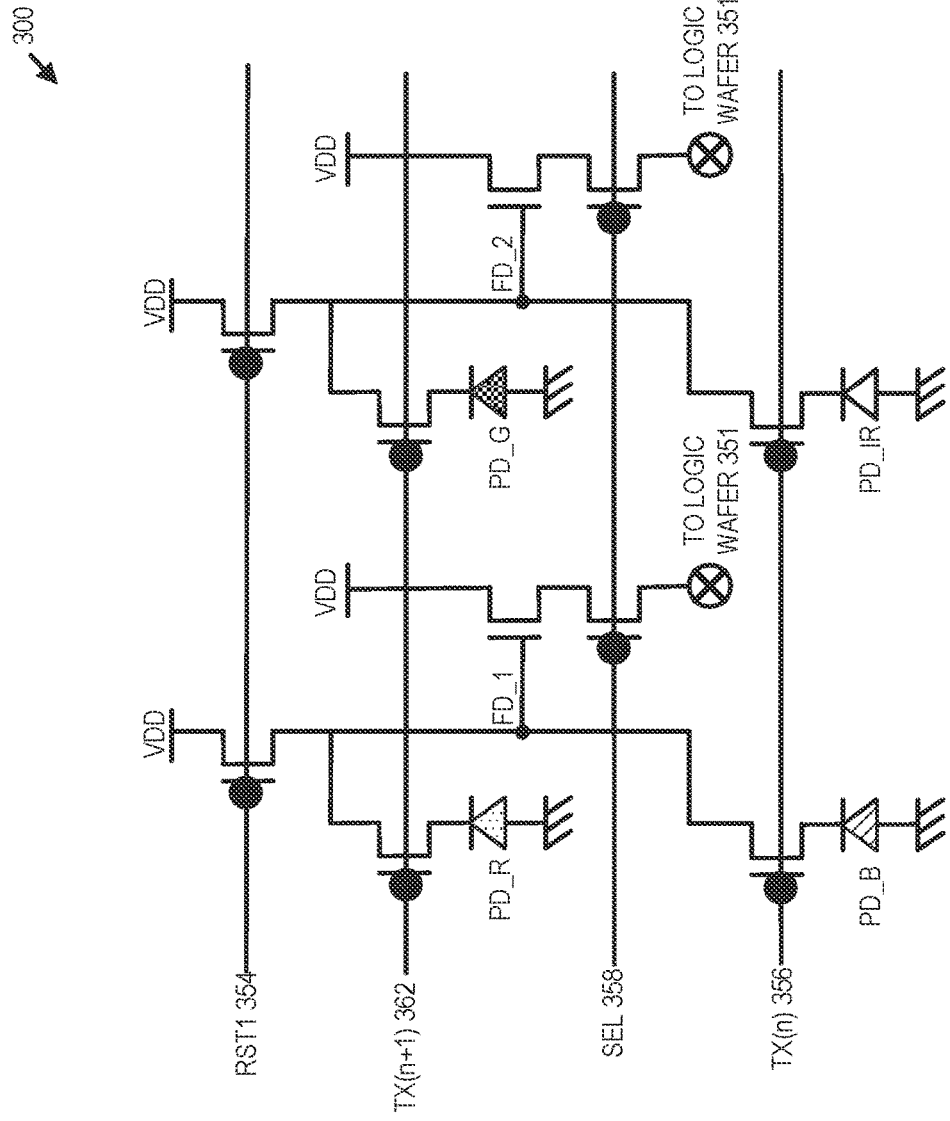
FIG. 3A illustrates an example pixel cell circuit diagram for a sensor wafer, in accordance with the teachings of the present disclosure.
Figure 3B:
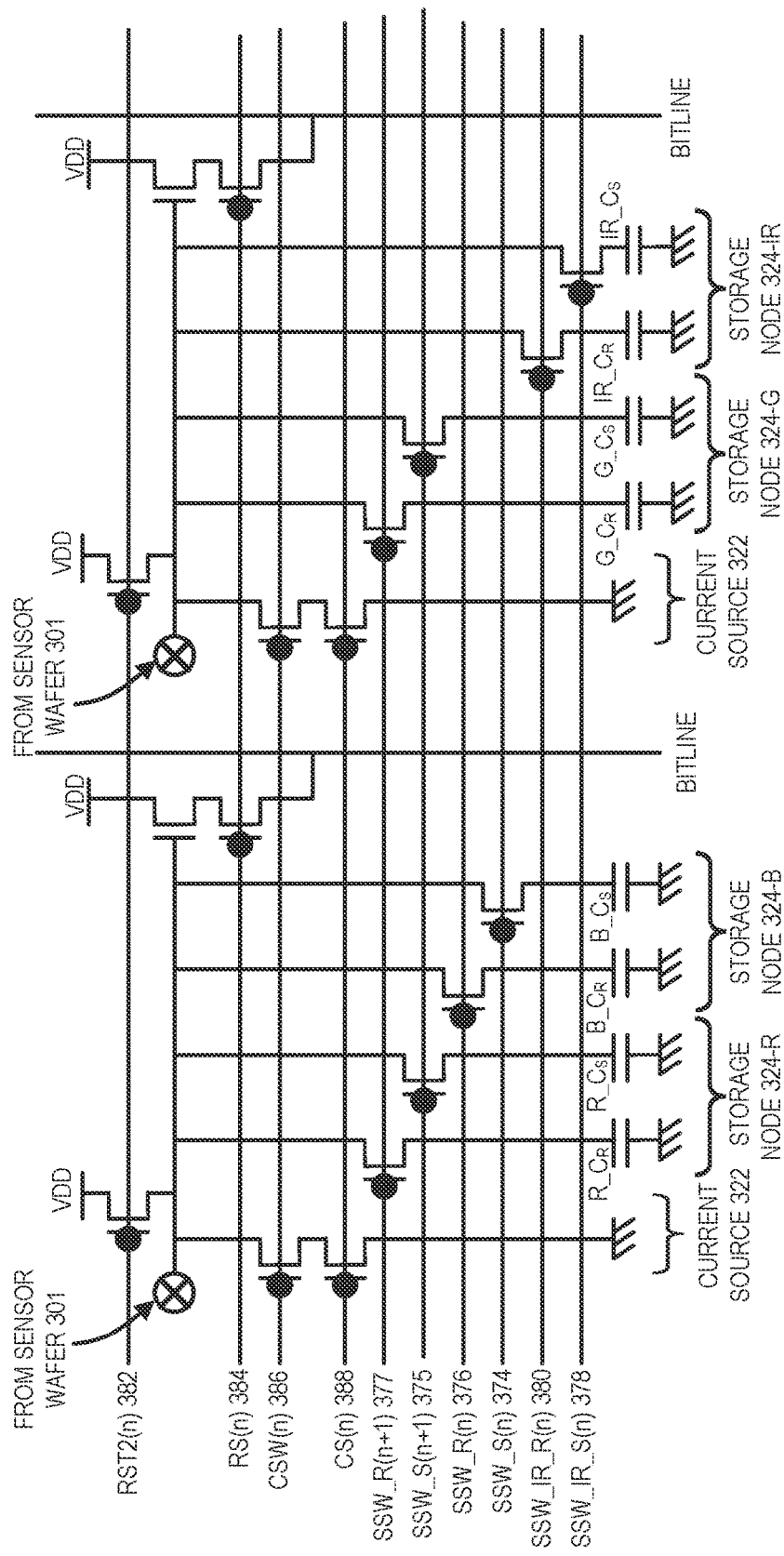
FIG. 3B illustrates an example pixel cell circuit diagram for a logic wafer, in accordance with the teachings of the present disclosure.

FIG. 3A and FIG. 3B respectively illustrate circuitry for a pixel cell on a sensor wafer 301 and a logic wafer 351, in accordance with the teachings of the present disclosure. It is appreciated that the circuit diagrams illustrated in FIG. 3A and FIG. 3B do not necessarily connote specific physical position of elements within or on the sensor wafer 301 and/or the logic wafer 351. Similar to the imaging system 100 illustrated in FIG. 1A-1F, the sensor wafer 301 includes a plurality of photodiodes (e.g., PD_B, PD_IR, PD_R, and PD_G) arranged in rows and columns to form the pixel cell. FIG. 3A illustrates circuitry 300 for the pixel cell on the sensor wafer 301, which includes a blue pixel (e.g., photodiode PD_B associated with a first pixel in a first row), an infrared pixel (e.g., photodiode PD_IR associated with a second pixel in the first row), a red pixel (e.g., photodiode PD_R associated with a third pixel in a second row), and a green pixel (e.g., photodiode PD_G associated with a fourth pixel in the second row). It is appreciated that the circuitry 300 is similar in many aspects to the circuitry of the sensor wafer 101 illustrated in FIG. 1D, which has been expanded to show a full pixel cell. To avoid obscuring the disclosure, certain elements have not been labeled in FIG. 3A (e.g., gates of individual transistors, source-follower transistors, and the like). One difference between the circuitry of the sensor wafer 101 illustrated in FIG. 1D and the circuitry 300 of the sensor wafer 301 illustrated in FIG. 3A, is that there are shared floating diffusion regions (e.g., FD_1 and FD_2). As illustrated in FIG. 3A, pixels of different rows share common floating diffusion regions. For example, PD_B and PD_R, which are respectively associated with the blue pixel included in the first row and the red pixel associated with the second row, both share the floating diffusion region FD_1. Similarly, PD_IR and PD_G, which are respectively associated with the infrared pixel included in the first row and the green pixel associated with the second row, both share the floating diffusion region FD_2. FIG. 3A also illustrates that control lines (e.g., RST1 354 and SEL 358) are coupled to control pixels of multiple rows (e.g., RST1 354 may be utilized to simultaneously reset the floating diffusion regions FD_1 and FD_2 and the photodiodes PD_B, PD_IR, PD_R, and PD_G in combination with the appropriate signal or pulse on the transfer control lines TX(n) 356 and TX(n+1) 362). In other embodiments, separate control lines for each row and function may be provided (e.g., first and second reset and selection control lines for the first and second rows).

Referring now to FIG. 3B, pixel circuitry 353 on or in the logic wafer 351 for the pixel cell is illustrated, which is similar in many regards to the pixel circuitry 153-N on or in the logic wafer 151 illustrated in FIG. 1D. Specifically, each photodiode is coupled to a corresponding storage node (e.g., storage node 324-B is associated with the blue pixel including PD_B of FIG. 3A, storage node 324-IR is associated with the infrared pixel including PD_IR of FIG. 3A, storage node 324-R is associated with the red pixel including PD_R of FIG. 3A, and storage node 324-G is associated with the green pixel including PD_G of FIG. 3A). It is appreciated that the pixel circuitry 353 is similar in many aspects to the pixel circuitry 153-N of the logic wafer 151 illustrated in FIG. 1D, which has been expanded to show a full pixel cell. For example, separate control lines for the storage node of non-visible pixels sharing a row with visible pixels (e.g., the infrared and blue pixels in the second row) are present to provide selective readout to the appropriate storage node (e.g., SSW_IR_S(n) 378 and SSW_IR_R(n) 380 are coupled to storage node 324-IR while SSW_S(n) 374 and SSW_R(n) 376 are coupled to storage node 324-B. In contrast, control lines for storage nodes associated with a row of only visible pixels (e.g., the red and green pixels in the second row) are shared (e.g., SSW_S(n+1) 375 and SSW_R(n+1) 377 are coupled to both storage node 324-R and storage node 324-G). It is appreciated that the control lines coupled to the pixel circuitry 353 illustrated in FIG. 3B may be analogous or otherwise similar in functionality to the control lines illustrated in FIG. 1F. In other words, SSW_S(n) 374 of FIG. 3B may correspond or be similar to first storage control line SSW_S(n) 174 of FIG. 1F, SSW_IR_S(n) 378 of FIG. 3B may correspond or be similar to second storage control line SSW_IR_S(n) 178 of FIG. 1F, SSW_R(n) 376 of FIG. 3B may correspond or be similar to first reset storage control line SSW_R(n) 176 of FIG. 1F, SSW_IR_R(n) 380 of FIG. 3B may correspond or be similar to second reset storage control line SSW_IR_R(n) 180 of FIG. 1F, RST2(n) 382 of FIG. 3B may correspond or be similar to control line $RST_2(n)$ 182 of FIG. 1F, RS(n) 384 of FIG. 3B may correspond or be similar to row select control line RS(n) 184 of FIG. 1F, CSW(n) 386 of FIG. 3B may correspond or be similar to control line CSW(n) 186 of FIG. 1F, $C_S(n)$ 388 of FIG. 3B may correspond or be similar to control line $C_S(n)$ 188 of FIG. 1F, SSW_S(n) 374 of FIG. 3B may correspond or be similar to third storage control line SSW_S(n+1) 175 of FIG. 1F, and SSW_R(n+1) 377 of FIG. 3B may correspond or be similar to third reset storage line SSW_R(n+1) 177 of FIG. 1F.

Figure 3C:
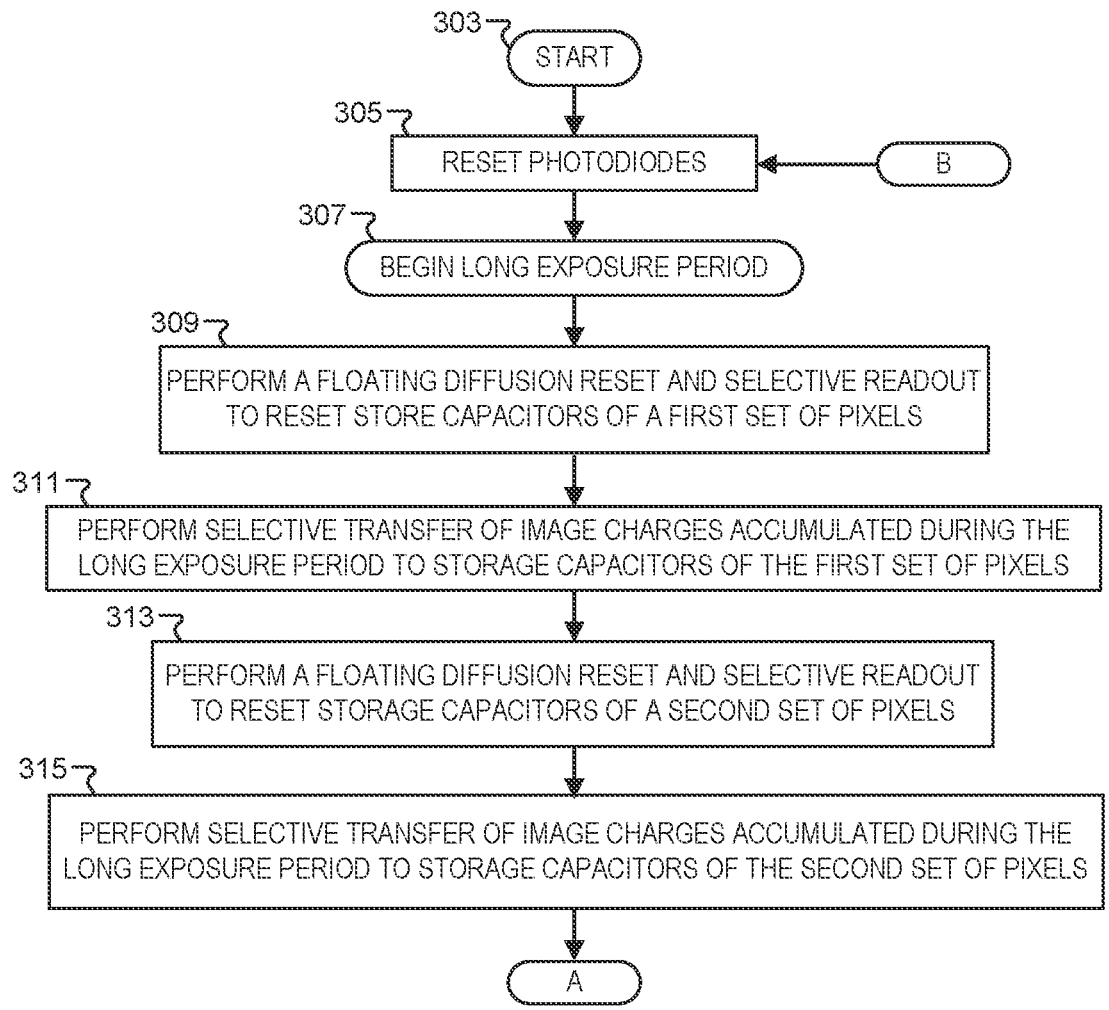
FIGS. 3C-3D illustrate an example method of operation for an imaging system with selective readout for visible-infrared image capture, in accordance with the teachings of the present disclosure.
Figure 3D:
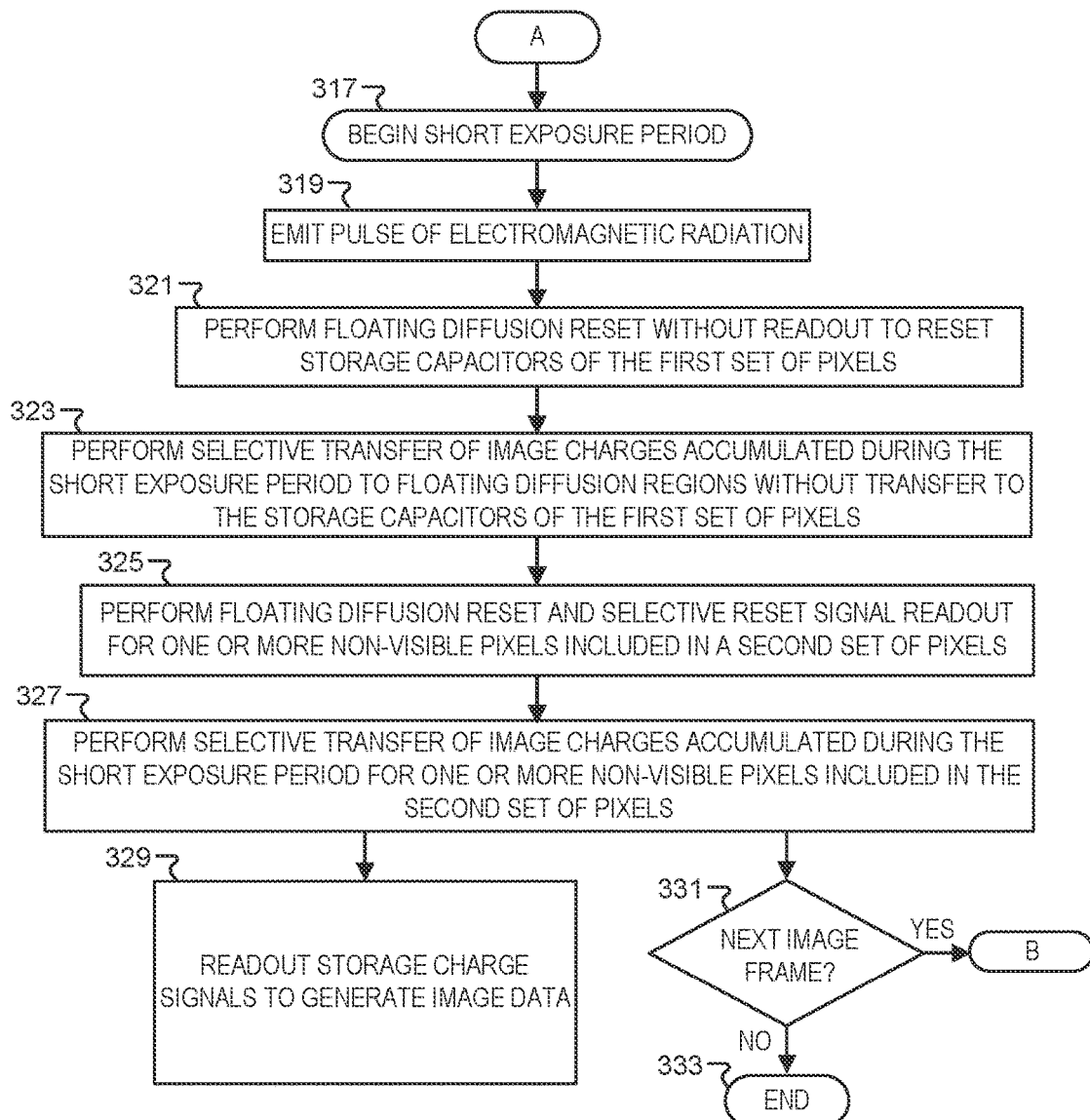

FIGS. 3C-3D illustrate an example method of operation 350 (i.e. 350-1 illustrated on FIG. 3C and 350-2 illustrated on FIG. 3D) for an imaging system with selective readout for visible-infrared image capture, in accordance with the teachings of the present disclosure. The method 350 may be implemented by an imaging system with pixel cell circuitry distributed across a sensor wafer and a logic wafer as illustrated in FIG. 3A and FIG. 3B (e.g., sensor wafer 301 illustrated in FIG. 3A and logic wafer 351 illustrated in FIG. 3B). The method 350 includes blocks 303, 305, 307, 309, 311, 313, 315, 317, 319, 321, 323, 325, 327, 329, 331, and 333. It is appreciated that the number blocks of method 350 including blocks 303-333, may occur in any order and even in parallel. Additionally, blocks may be added to, or removed from, method 350 in accordance with the teachings of the present disclosure. It is appreciated that method 350 represents one possible implementation for operating an imaging system with pixel cell circuitry distributed across a sensor wafer and a logic wafer as illustrated in FIG. 3A and FIG. 3B (e.g., sensor wafer 301 illustrated in FIG. 3A and logic wafer 351 illustrated in FIG. 3B). Additionally, it is appreciated that method 350 is not limited to only the imaging system illustrated in FIG. 3A-3B, but rather the method 350 may be applicable for controlling operation of other embodiments of imaging systems and/or image sensors. As illustrated in FIG. 3C and FIG. 3D, each cycle of the method 350 (e.g., a group of blocks 305-329) may represent capture of an individual image frame representative of an external scene. It is appreciated that a plurality of image frames (e.g., a first image frame, a second image frame, and so on) may be captured to generate a video of the external scene.

Block 303 of FIG. 3C illustrates a start or initiation of the method 350 in which capture of one or more image frames with multiple exposure durations is to occur (e.g. one or more image frames that utilize both visible and infrared image signals to image an external scene). In some embodiments, block 303 may be analogous to block 202 illustrated in FIG. 2A and may include the same or similar features.

Block 305 of FIG. 3C shows resetting a plurality of photodiodes (e.g., PD_B, PD_IR, PD_R, and PD_G illustrated in FIG. 3A). The plurality of photodiodes may be reset in response to the assertion of a reset signal (e.g., a pulse applied to RST1 354, TX(n) 356, and TX(n+1) 362 control lines illustrated in FIG. 3A) to provide a predetermined potential (e.g., VDD illustrated in FIG. 3A or other appropriate predetermined potential) and allow accumulation of image charge during a long exposure period. In some embodiments, block 305 may be analogous to block 204 illustrated in FIG. 2A and may include the same or similar features.

Block 307 of FIG. 3C illustrates beginning the long exposure period for the image frame. During the long exposure period, image charge is accumulated in the plurality of photodiodes in response to the plurality of photodiodes being reset (e.g., from block 307). The accumulated image charges are representative of the external scene and have a magnitude based on an intensity of light incident on a given photodiode included in the plurality of photodiodes. In some embodiments, block 307 may be analogous to block 202 illustrated in FIG. 2A and may include the same or similar features.

Block 309 of FIG. 3C shows performing a floating diffusion reset of the image frame (e.g., the first image frame) and selective readout to reset storage capacitors of a first set of pixels. In the case of shared floating diffusion regions (e.g., each floating diffusion region shared by two adjacent pixels in the same column as illustrated in FIG. 3A), the first set of pixels is complemented by a second set of pixels, which collectively cover the plurality of pixels (e.g., each pixel cell formed from the plurality of pixels). For example, in the illustrated embodiment, the first set of pixels corresponds to the pixels associated with PD_R and PD_G (e.g., row n+1) and the second set of pixels corresponds to the pixels associated with PD_B and PD_IR (e.g., row n), which collectively cover the plurality of pixels as illustrated in FIG. 3A. However, it is appreciated that different schemes of shared floating diffusion regions may also be utilized (e.g., PD_IR in the same row as any of PD_R, PD_G, or PD_B), depending on the specific layout or arrangement of the plurality of pixels.

The shared floating diffusion regions (e.g., FD_1 and FD_2 illustrated in FIG. 3A), may be reset by asserting or otherwise applying a pulse to the appropriate control lines (e.g., RST1 354 and TX(n+1) 362 for the first set of pixels). Upon resetting the floating diffusion regions, the reset level of the floating diffusion regions may be selectively readout to a corresponding reset storage capacitor (e.g., in the case of the first set of pixels, TX(n+1) is asserted to respectively readout the reset level for FD_1 and FD_2 illustrated in FIG. 3A to $R\_C_R$ and $G\_C_R$ illustrated in FIG. 3B) by asserting or otherwise applying a pulse to the appropriate control lines (e.g., in the case of the first set of pixels, SEL 358 of FIG. 3A and SSW_R(n+1) 377 of FIG. 3B).

Block 311 of FIG. 3C illustrates performing selective transfer of image charges accumulated during the long exposure period to storage capacitors of the first set of pixels (e.g., $R\_C_S$ and $G\_CS_S$ illustrated in FIG. 3B for the first set of pixels). In one embodiment, the image charges accumulated during the long exposure period in PD_R and PD_G of FIG. 3A are respectively transferred to the floating diffusion regions FD_1 and FD_2 (e.g., by asserting or otherwise applying a pulse to TX(n+1) 362 illustrated in FIG. 3A and then reading out long exposure image signals representative of image charges to the appropriate storage capacitors (e.g., $R\_C_S$ and $G\_C_S$ illustrated in FIG. 3B) by asserting the appropriate control lines (e.g., applying a pulse to SEL 358 illustrated in FIG. 3A and SSW_S(n+1) 375 illustrated in FIG. 3B).

Block 313 of FIG. 3C shows performing a floating diffusion reset of the image frame (e.g., the first image frame) and selective readout to reset storage capacitors of the second set of pixels (e.g., pixels associated with PD_B and PD_IR illustrated in FIG. 3A). The shared floating diffusion regions (e.g., FD_1 and FD_2 illustrated in FIG. 3A), may be reset by asserting or otherwise applying a pulse to the appropriate control lines (e.g., RST1 354 and TX(n) 356 for the second set of pixels). Upon resetting the floating diffusion regions, the reset level of the floating diffusion regions may be selectively readout to a corresponding reset storage capacitor (e.g., in the case of the second set of pixels, TX(n) is asserted to respectively readout the reset level for FD_1 and FD_2 illustrated in FIG. 3A to $B\_C_R$ and $IR\_C_R$ illustrated in FIG. 3B) by asserting or otherwise applying a pulse to the appropriate control lines (e.g., in the case of the second set of pixels, SEL 358 of FIG. 3A, SSW_R(n) 376, and SSW_IR_R(n) 380 of FIG. 3B).

Block 315 of FIG. 3C illustrates performing selective transfer of image charges accumulated during the long exposure period to storage capacitors of the second set of pixels (e.g., $B\_C_S$ and $IR\_C_S$ illustrated in FIG. 3B for the second set of pixels). In one embodiment, the image charges accumulated during the long exposure period in PD_B and PD_IR of FIG. 3A are respectively transferred to the floating diffusion regions FD_1 and FD_2 (e.g., by asserting or otherwise applying a pulse to TX(n) 356 illustrated in FIG. 3A and then reading out long exposure image signals representative of image charges to the appropriate storage capacitors (e.g., $B\_C_S$ and $IR\_C_S$ illustrated in FIG. 3B) by asserting the appropriate control lines (e.g., applying a pulse to SEL 358 illustrated in FIG. 3A, SSW_S(n) 374, and SSW_IR_S(n) 378 illustrated in FIG. 3B).

It is appreciated that in some embodiments, blocks 309 and 313 of method 350 illustrated in FIG. 3C may collectively correspond to block 208 of method 200 illustrated in FIG. 2A, all of which may include the same or similar features. Additionally, in the same or other embodiments, blocks 311 and 315 of method 350 illustrated in FIG. 3C may collectively correspond to block 210 and 212 of method 200 illustrated in FIG. 2A, all of which may include the same or similar features. Referring back to FIG. 3C, block 315 proceeds through "A" to block 317 illustrated on FIG. 3D.

Block 317 of FIG. 3D shows beginning the short exposure period for the image frame. In some embodiments, the short exposure period may begin in response to resetting the plurality of photodiodes. In other words, during block 317 the plurality of photodiodes may be reset (e.g., in the manner described in block 305 illustrated in FIG. 3C). The plurality of photodiodes may accumulate image charges representative of the external scene and have a magnitude based on an intensity of light incident on a given photodiode included in the plurality of photodiodes during the short exposure period. In some embodiments, block 317 may be analogous to block 214 illustrated in FIG. 2A and may include the same or similar features.

Block 319 of FIG. 3D illustrates emitting a pulse of a first spectrum of electromagnetic radiation (e.g., by a light source) during the short exposure period of the image (e.g., the first image frame). In some embodiments, the light source may be included in the image sensor while in other embodiments, the light source may be arranged external to the image sensor. It is appreciated that to mitigate crosstalk between the short exposure period of the image frame and the long exposure period of a subsequent image frame, a pulse duration of the pulse is less than the short exposure duration of the short exposure period of the image frame. In some embodiments, the pulse duration of the pulse is more than ten times less than the duration of the long exposure period, which may enable capture of non-visible images during the short exposure period with minimal consequences on the visible images captured during the long exposure period. It is appreciated that the first spectrum of electromagnetic radiation includes a first wavelength, which may be within the infrared range of the electromagnetic spectrum (e.g., from near-infrared to far-infrared such as 800 nm to 3000 nm). During the short exposure period, the plurality of photodiodes accumulate image charge in response to the pulse of the first spectrum of electromagnetic radiation reflecting off one or more objects in the external scene to be incident upon the plurality of photodiodes, which may be utilized to generate an illuminated image without disturbing human eyes (e.g., a non-visible image based on electromagnetic radiation outside of the visible spectrum), or to generate depth or distance information associated with the external scene (e.g., distance or depth one or more pixels included in the plurality of pixels are from the external scene). In some embodiments, time of flight information and/or phase difference information may be computed based on the image charges accumulated during the short exposure period. In some embodiments, block 319 may be analogous to block 216 illustrated in FIG. 2A and may include the same or similar features.

Block 321 of FIG. 3D shows performing a floating diffusion reset without readout to reset storage capacitors of the first set of pixels. In other words, the floating diffusion regions (e.g., FD_1 and FD_2) may be reset, but the reset level of the floating diffusion regions will not be determined as short exposure reset signals are not needed for visible pixels (e.g., the pixels associated with PD_R and PD_G illustrated in FIG. 3A), since the illustrated embodiment of FIGS. 3A-3D utilized infrared pixels (e.g., the pixels associated with PD_IR illustrated in FIG. 3A) to determine short exposure image and reset signals. Reset of the floating diffusion regions may be achieved by asserting the appropriate control lines (e.g., a pulse applied to RST1 354 illustrated on FIG. 3A and not SSW_R(n+1) 377 illustrated in FIG. 3B).

Block 323 of FIG. 3D shows performing selective transfer of image charges accumulated during the short exposure period of the image frame (e.g., the first image frame) to the floating diffusion without transfer to the storage capacitors of the first set of pixels (e.g., .R_$C_S$ and G_$CS_S$ illustrated in FIG. 3B). Similarly to block 321, short exposure image signals for the first set of pixels, or more specifically, visible pixels are not needed in the illustrated embodiment. The selective transfer may be performed by asserting the appropriate control lines (e.g., a pulse applied to TX(n+1) 362 and RST1 354 illustrated on FIG. 3A, but not SSW_S(n+1) 375 illustrated on FIG. 3B).

Block 325 of FIG. 3D illustrates performing a floating diffusion reset for one or more non-visible pixels (e.g., the pixel associated with PD_IR illustrated in FIG. 3A) and selective short exposure reset signal readout to reset storage capacitors (e.g., IR_$C_R$ illustrated in FIG. 3B) for the one or more non-visible pixels of the second set of pixels. The second set of pixels (per pixel cell) includes both visible and non-visible pixels, but short exposure image signals are only desired for pixels that are sensitive to the emitted electromagnetic radiation (e.g., infrared pixels, which correspond to the non-visible pixels). Accordingly, short exposure reset and image signals are to be obtained for the non-visible pixels while maintaining the long exposure reset and image signals obtained previously (e.g., during blocks 309, 311, 313, and 315 illustrated in FIG. 3C). Reset of the floating diffusion regions and short exposure reset signal readout may be achieved by asserting the appropriate control lines (e.g., a pulse applied to RST1 354 and SEL 358 illustrated in FIG. 3A and SSW_IR_R(n) 380 illustrated in FIG. 3B, but not SSW_R(n) 376 illustrated in FIG. 3B).

Block 327 of FIG. 3D shows performing selective transfer of image charges accumulated during the short exposure period of the image frame (e.g., the first image frame) to the floating diffusion for one or more non-visible pixels (e.g., the pixel associated with PD_IR illustrated in FIG. 3A) and short exposure image signal readout to storage capacitors for the one or more non-visible pixels. As discussed previously, short exposure image signals for the non-visible pixels included in the second set of pixels is desired, while the long exposure image signals for the visible pixels are to be maintained. The selective transfer and readout may be performed by asserting the appropriate control lines (e.g., a pulse applied to TX(n) 362 and SEL 358 illustrated on FIG. 3A and SSW_IR_S(n) 378 illustrated in FIG. 3B, but not SSW_S(n) 374 illustrated on FIG. 3B). It is appreciated that the selective readout and reset results in the long exposure image signals associated with the non-visible pixels (e.g., charge stored in IR_$C_S$ illustrated in FIG. 3B) being replaced with respective short exposure image signals.

It is appreciated that in some embodiments, blocks 321 and 325 of method 350 illustrated in FIG. 3C may collectively correspond to block 218 of method 200 illustrated in FIG. 2A, all of which may include the same or similar features. Additionally, in the same or other embodiments, blocks 323 and 327 of method 350 illustrated in FIG. 3C may collectively correspond to blocks 220 and 222 of method 200 illustrated in FIG. 2A, all of which may include the same or similar features.

Block 329 of FIG. 3D illustrate s reading out storage charge signals from the plurality of storage capacitors (e.g., the storage capacitors R_$C_S$, B_$C_S$, G_$C_S$, and IR_$C_S$ as illustrated in FIG. 3B) for each of the plurality of pixels and the plurality of reset capacitors (e.g., the reset storage capacitor R_$C_R$, B_$C_R$, G_$C_R$, and IR_$C_R$ as illustrated in FIG. 3B) for each of the plurality of pixels to generate image data corresponding to or otherwise representative of the image frame (e.g., the first image frame) by asserting the appropriate control lines (e.g., a pulse applied to one or more of SSW_R(n+1) 377, SSW_S(n+1) 375, SSW_R(n) 376, SSW_S(n) 374, SSW_IR_R(n) 380, or SSW_IR_S(n) 378 and RS(n) 384 of FIG. 3B at the appropriate times) to readout the storage charge signals to the bitline, which in turn goes to column circuits that convert the signal level minus the reset level to a digital value (e.g., image data). It is appreciated that in some embodiments, reading out the storage charge signals may occur on a row-by-row basis (e.g., when the plurality of photodiodes are accumulating image charges of a subsequent image frame). In some embodiments, block 329 may be analogous to block 224 illustrated in FIG. 2A and may include the same or similar features.

If additional image frames are to be captured, then block 331 proceeds back to block 305 through "B" and the method 350 continues to capture the next image frame. If additional image frames are not desired, then block 331 proceeds to block 333 and the method 350 ends or otherwise terminates.

Figure 4:
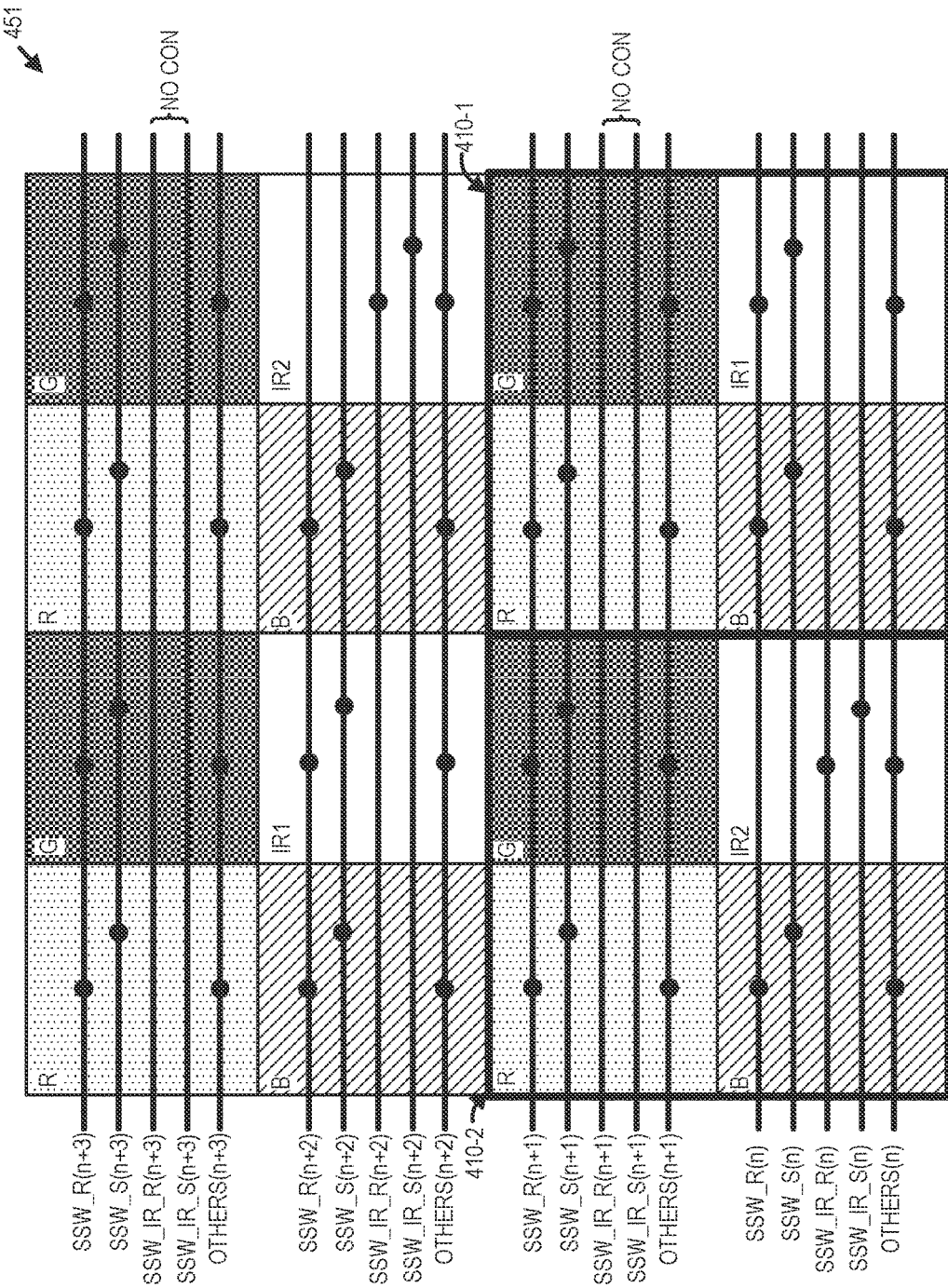
FIG. 4 illustrates an example pixel control line arrangement of a logic wafer, in accordance with the teachings of the present disclosure.

FIG. 4 illustrates an example pixel control line arrangement 400 of a logic wafer 451, in accordance with the teachings of the present disclosure. It is appreciated that the control line arrangement 400 illustrated a plurality of pixel cells 410 (e.g., a first pixel cell 410-1 and a second pixel cell 410-2) may have circuitry similar to various embodiments of the disclosure (e.g., the distributed circuitry arrangement illustrated in FIG. 1D, FIG. 3A, and/or FIG. 3B), which may incorporate the various methods of the disclosure (e.g., method 200 illustrated in FIG. 2A and/or method 350 illustrated in FIG. 3C and FIG. 3D). Accordingly, the control line arrangement 400 illustrated in FIG. 4 shows control line traces for rows n, n+1, n+2, and n+3, which includes SSW_R, SSW_S, SSW_IR, and SSW_IR_S, with function similar to like-named control lines described in embodiments of the disclosure. The control line arrangement 400 also includes a blanket label of "Others," which provides a collective representation of control lines not explicitly illustrated that may otherwise be present (e.g., $C_S(n)$, CSW(n), RS(n), and $RST_2(n)$ for OTHERS(n), and so on).

As illustrated in FIG. 4, some rows contain only visible pixels (e.g., row n+1 and row n+3), while other rows contain both visible and non-visible pixels (e.g., row n and row n+2). However, in the illustrated embodiment, it may not be desirable to obtain short exposure image and reset signals for each infrared pixel (e.g., pixels labeled IR1 and IR2). For example, lower resolution non-visible images (e.g., images based on infrared light or other non-visible electromagnetic radiation) of the external scene may be acceptable, which may free up every other infrared pixel (e.g., IR1 or IR2) to be utilized for purposes other than generating short exposure image signals. Thus, in some embodiments either IR1 or IR2 may be utilized to generate calibration image signals for the visible color pixels (e.g., red, green, and blue pixels) during the long exposure period. For example, infrared pixel IR1 (first type infrared pixel) may be configured to store image signal and reset signal captured during the short exposure period to capture emitted non-visible light without interference from nearby visible color pixels (e.g., red, green, and blue pixels) and infrared pixel IR2 (second type infrared pixel) may be configured to store image and reset signals captured at the same time as other visible color pixels during the long exposure period for pixel calibration purposes to reduce color crosstalk between infrared and nearby visible color pixels. In some embodiments, the IR1 and IR2 pixels may be structurally identical. However, in other embodiments, the IR1 and IR2 pixels may differ from one another (e.g., via color filter or other components) depending on their intended function. In one embodiment, the color filter associated with the IR2 pixels may block or otherwise attenuate visible light to generate a reference signal that could be subtracted from the long exposure image signal associated with nearby visible pixels (e.g., to mitigate the influence of ambient infrared light affecting the long exposure image signals). In other embodiments, the color filter of the IR2 pixels may block all light to generate a black reference signal to be subtracted from the long exposure image signals.

It is appreciated that in the illustrated embodiment, the infrared pixels IR1 and IR2 are coupled to control lines (e.g., SSW_R(n), SSW_S(n), SSW_IR_S(n), and so on) differently, which is not necessarily identical on a row-by-row basis (e.g., the connections for the control lines of row n are not necessarily the same as the connections for the control lines of row n+1). For example, for pixels in a given row (e.g., row n, which includes two blue (B) pixels, an IR1 pixel, and an IR2 pixel of the sensor wafer, where first B pixel is adjacent to IR2 and the second B pixel is adjacent to IR1 and IR2), the control lines are coupled to the pixel circuitry of the pixels in a specific manner. Each of the pixels may include corresponding storage capacitors, reset storage capacitors, storage gates, storage transistors, reset storage gates, reset storage transistors, and the like as illustrated in accordance with FIG. 1D, meaning for a given row illustrated in FIG. 4, each pixel has corresponding pixel circuitry (e.g., at least four storage capacitors in row n, at least four storage gates in row n, and so on). Referring back to FIG. 4 in the context of FIG. 1D, the storage control line SSW_S(n) is coupled to the storage gates of the blue pixels in row n and the IR1 pixel in row n, but not the storage gate of the IR2 pixel of row n. The separate control line for readout of the IR2 pixel (e.g., via SSW_IR_S(n)) in row n allows for selective storage of image signals relative to the blue pixels and the IR1 pixel in row n. The same is similarly true for the reset operation (e.g., via SSW_R and SSW_IR_R). Additionally, it is appreciated that the connections for the IR1 and IR2 pixels alternate in the illustrated embodiment. For example, in row n+2, IR1 is positioned in the same column as IR2 in row n. It is further appreciated that in some embodiments IR1 and IR2 pixels may be arranged alternatively on a row basis in a pixel array for row readout convenience. For example, one or more first visible color pixels (e.g., red, green, blue, or other color) and a first non-visible pixel (e.g., the first infrared or IR1 pixel) that share control lines (e.g., via SSW_R(n) and SSW_S(n) for simultaneous readout and reset of the first visible color pixels and the first non-visible pixel) are arranged in a first common row, while, one or more second visible color pixels (e.g., red, green, blue, or other color) and a second non-visible pixel (e.g., the second infrared or IR2 pixel) that can be readout and reset independently of one another (e.g., separate control lines such as SSW_IR_R(n) and SSW_IR_S(n) to readout and reset the IR2 pixel independently from the second visible color pixels), are arranged in a second common row, wherein the first and second common rows are arranged alternately in a pixel array.

Thus, in the illustrated embodiments, there are generally two types of adjacent pixel pair connections. A first pair of pixels along a common row that include a visible (e.g., red, green, blue, or other color) and non-visible pixel (e.g., infrared) that can be readout and reset independently of one another (i.e., separate control lines such as SSW_IR_R(n) and SSW_IR_S(n) to readout and reset IR2 of row n independent from B and IR1 pixels of row n) and a second pair of pixels along a common row that include a visible (e.g., red, green, blue, or other color) and non-visible pixel (e.g., infrared) that cannot be readout and reset independently of one another (i.e., shared control lines such as SSW_R(n) and SSW_S(n) to simultaneously readout and reset the B pixels and the IR1 pixels of row n). Operation can then be achieved as discussed in relation to FIG. 2A, FIG. 3C, and/or FIG. 3D. For example, in an image frame with both a short exposure period and a long exposure period, image charges during the short exposure period can be stored (e.g., via control lines associated with IR2) while also storing image charges during the long exposure period of the image frame (e.g., control lines associated with R, G, B, and IR1 pixels).

In one embodiment, the operations include transferring first image charges accumulated during a long exposure period of a first image frame to respective floating diffusion regions of first, second, third, and fourth pixel, reading out long exposure image signals from the respective floating diffusion regions to respective storage capacitors (e.g., first, second, third, and fourth storage capacitors respectively associated with first, second, third, and fourth pixels), and reading out storage charge signals from the first storage capacitor, the second storage capacitor, the third storage capacitor, and the fourth storage capacitor to generate image data for the first image frame such that the image data is based on a corresponding one of the long exposure image signals associated with the first pixel, the third pixel and the fourth pixel (e.g., red, green, blue, and/or IR1 pixels), and the short exposure image signal associated with the second pixel (e.g., IR2 pixel). This may be achieved by asserting a first storage control line signal, a second storage control line signal, and a third storage control line signal after the long exposure period of the first image frame to initiate the reading out the long exposure image signals and asserting the second storage control line signal and not the first storage control line signal nor the third storage control line to initiate the reading out the short exposure image signal to the second storage capacitor and replace a previous storage signal associated with the long exposure period of the first image frame. The first storage control line signal may be applied to SSW_S(n), the second storage control line signal may be applied to SSW_IR_S(n), and the third storage control line signal applied to SSW_S(n+1) or some other SSW_S control line on a different row from row n, when the first, third, and fourth pixels are spread across more than one row.

Figure 5A:
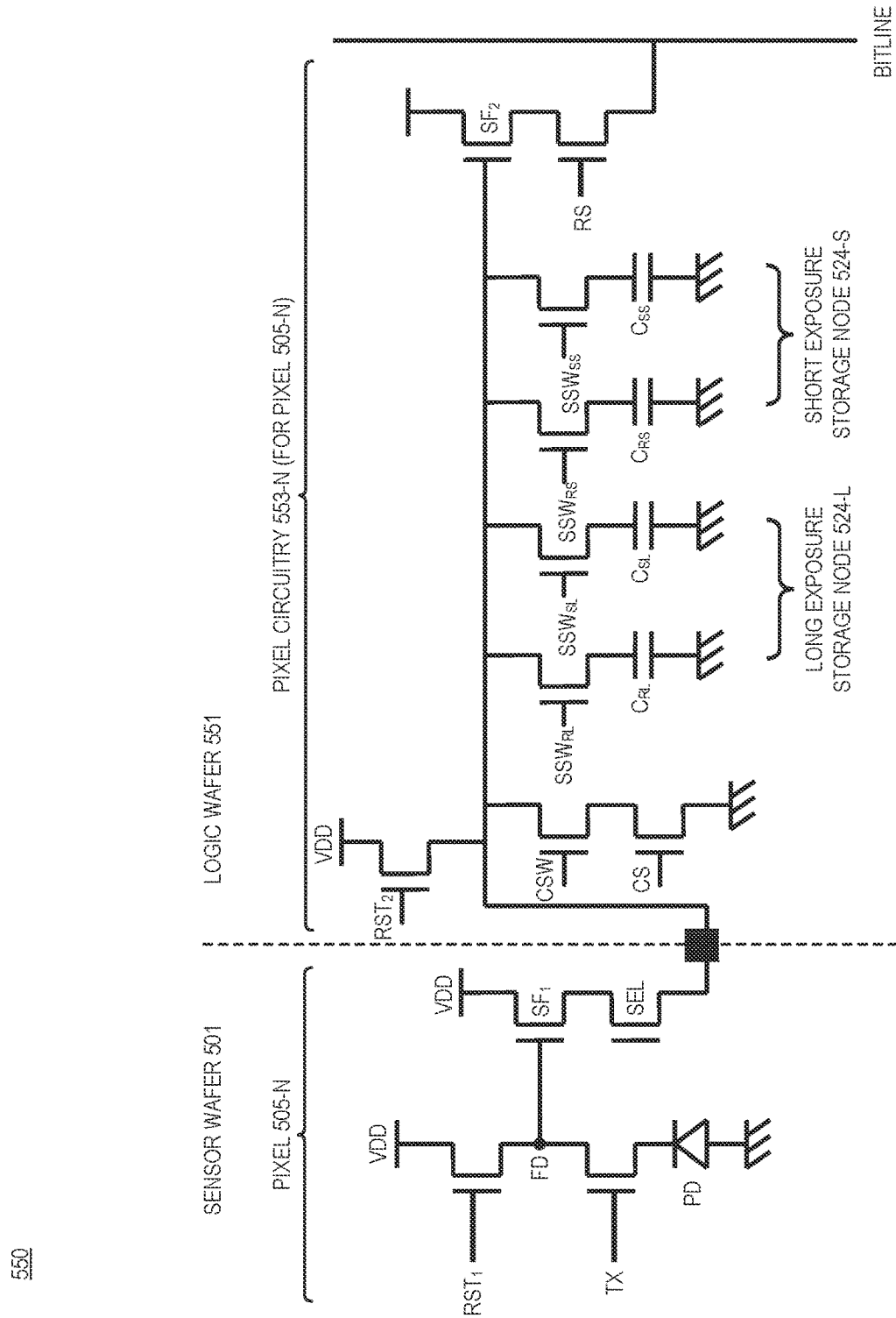
FIG. 5A illustrates an example pixel circuit for an imaging system, in accordance with the teachings of the present disclosure.

FIG. 5A illustrates an example pixel circuit 550 for an individual pixel 505-N included in a plurality of pixels of an imaging system, in accordance with the teachings of the present disclosure. More specifically, the pixel circuit 550 illustrated in FIG. 5A is distributed across at least a sensor wafer 501 and a logic wafer 551 with circuitry for the pixel 505-N located on the sensor wafer 501 and pixel circuitry 553-N located on the logic wafer 551. Pixel circuit 550 is similar in many regards to the pixel circuit 150 illustrated in FIG. 1D. Thus, the pixel circuit 550 of FIG. 5A includes like labeled elements (e.g., VDD, RST$_1$, FD, TX, PD, SF$_1$, SEL, RST$_2$, CSW, C$_S$, RS, SF$_2$, CSW, C$_S$, and BITLINE) that may operate in a similar manner or otherwise include the same features as described in relation to FIG. 1D. In other words, the pixel circuit 550 may be one possible implementation of the imaging system 100 illustrated in FIG. 1A and include the same or similar features. Accordingly, the pixel circuit 550 may be implemented in the various embodiments of the disclosure.

One difference between the pixel circuit 150 of FIG. 1D and the pixel circuit 550 of FIG. 5A, is that the pixel circuitry 553-N for the pixel 505-N includes a group of at least four capacitors (e.g., C$_{RL}$, C$_{SL}$, C$_{RS}$, C$_{SS}$). In other words, instead of each pixel having just one storage node (as illustrated in pixel circuit 150 of FIG. 1D), each pixel in the pixel circuit 550 includes at least two storage nodes to capture image frames using multiple exposure periods (e.g., long exposure node 524-L and short exposure node 524-S). Thus, a first pixel included in the plurality of pixels (e.g., a first instance of the pixel circuit 550) includes a first group of four capacitors, including a first storage capacitor (e.g., a first instance of C$_{SL}$ or C$_{SS}$), each associated with the first pixel and a second pixel included in the plurality of pixels (e.g., a second instance of the pixel circuit 550) includes a second group of four capacitors, including the second storage capacitor (e.g., a second instance of C$_{SL}$ or C$_{SS}$), each associated with the second pixel. In some embodiments, the number of storage nodes per pixel match the number of exposure periods per image frame (e.g., short exposure storage node 524-S for the short exposure period, and long exposure node 524-L for the long exposure period), which may be advantageous for certain pixel layouts. For example, in one embodiment, each pixel cell may be formed of visible pixels (e.g., a red pixel, a blue pixel, and two green pixels). In the same or other embodiments, the color filters of one or more of the visible pixels may permit enough infrared light to be transmitted that short exposure image signals associated with emitted infrared light may still be captured.

Figure 5B:
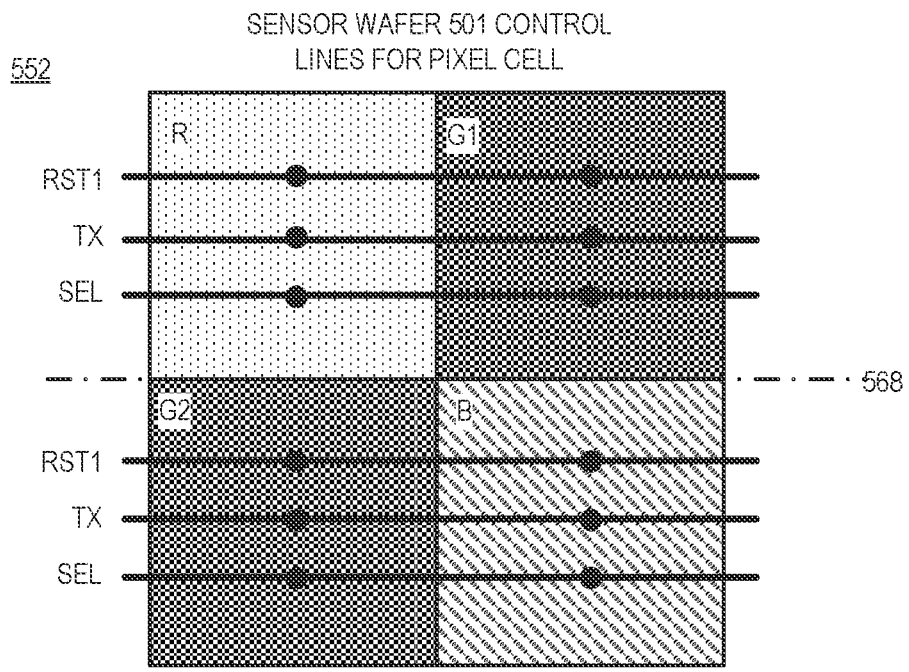
FIG. 5B illustrates an example pixel control line arrangement of the sensor wafer of the imaging system illustrated in FIG. 5A, in accordance with the teachings of the present disclosure.

FIG. 5B illustrates an example pixel control line arrangement 552 of the sensor wafer 501 of the imaging system illustrated in FIG. 5A, in accordance with the teachings of the present disclosure. The pixel control line arrangement 552 illustrated in FIG. 5B is similar to the pixel control line arrangement 152 illustrated in FIG. 1E and may include the same or similar features. One difference is the pixel layout of individual pixel cells. Rather than including infrared pixels, the pixel cell includes a red pixel (e.g., pixel labeled R), a blue pixel (e.g., pixel labeled B), and two green pixels (e.g., pixels labeled G1 and G2) that may be arranged based on Bayer pattern. In other words, adjacent pixels are different visible color pixels for a given pixel cell (e.g., G1 and R are different visible color pixels, G2 and B are different visible color pixels, and so on). It is appreciated that the control lines (e.g., RST1, TX, and SEL) may respectively be utilized to apply a pulse to the coupled circuit element for that pixel (e.g., the SEL control line of FIG. 5B is operable to control the SEL transistor illustrated in FIG. 5A), in accordance with embodiments of the disclosure. In the same or other embodiments, control lines of adjacent rows (e.g., row n and row n+1) may be symmetrical about axis 568.

Figure 5C:
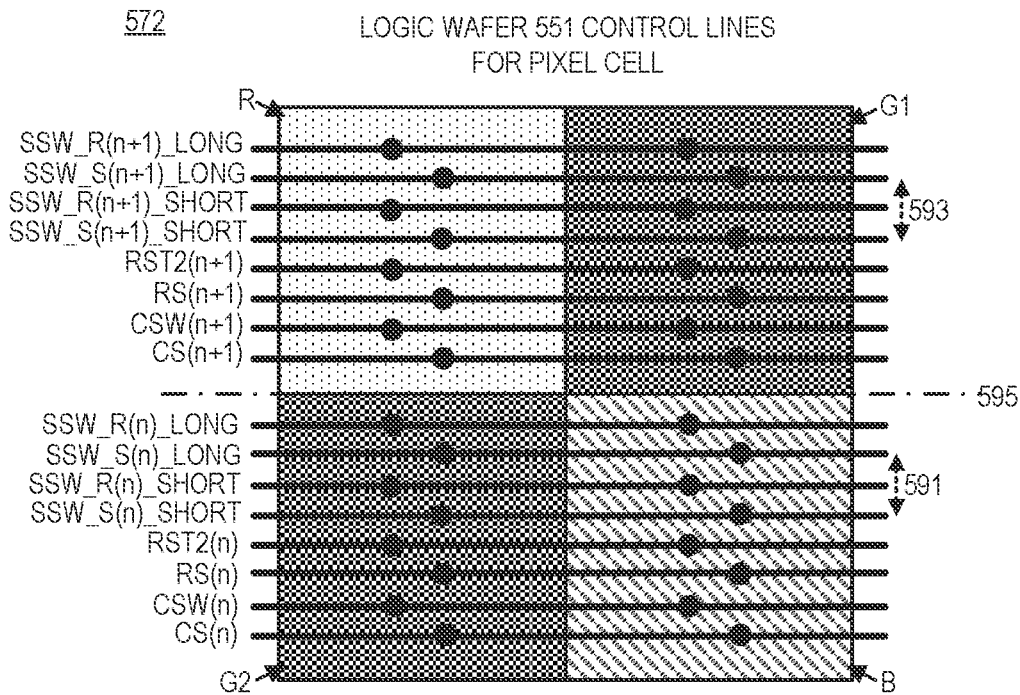
FIG. 5C illustrates an example pixel control line arrangement of the logic wafer illustrated in FIG. 5A, in accordance with the teachings of the present disclosure.

FIG. 5C illustrates an example pixel control line arrangement 572 of the logic wafer 551 illustrated in FIG. 5A, in accordance with the teachings of the present disclosure. The pixel control line arrangement 572 illustrated in FIG. 5B is similar to the pixel control line arrangement 172 illustrated in FIG. 1F and may include the same or similar features. Once difference is that instead of having dummy control lines (e.g., control line SSW_IR_S(n+1) 179 and SSW_IR_R(n+1) 181 illustrated in FIG. 1F), there are individual control lines coupled to each capacitor included in each of the plurality of storage nodes (e.g., SSW_R(n)_LONG, SSW(S(n)_LONG, SSW_R(n)_SHORT, and SSW_S(n)_SHORT of FIG. 5C respectively coupled to capacitors C$_{RL}$, C$_{SL}$, C$_{RS}$, and C$_{SS}$ illustrated in FIG. 5A), to generate image and reset signals for each exposure period (e.g., the long exposure period and the short exposure period) without having to replace any signals previously stored (e.g., the short exposure image and reset signals may be obtained without replacing the long exposure image and reset signals). Since the capacitors for each pixel (e.g., the group of four capacitors collectively included in the long exposure storage node 524-L and short exposure storage node 524-S), are controlled on a row-by-row basis (e.g., row n, row n+1, and so on), then each storage control line (e.g., the first storage control line corresponding to SSW_S(n)_LONG or SSW_S(n)_SHORT is coupled to multiple transistor gates (e.g., the gates associated with SSW$_{SL}$ or SSW$_{SS}$ transistors illustrated in FIG. 5A for each pixel in a given row).

The control line arrangement 572 of the logic wafer 551 of FIG. 5C is similar to the control line arrangement 172 of FIG. 1F in many ways as well. For example, control lines for the logic wafer 551 associated with adjacent rows (e.g., row n and row n+1) may be symmetrical about axis 595. In the same or other embodiments, the control lines are positioned to maintain control line symmetry of the logic wafer 551 such that a first separation distance 591 between the control line SSW_S(n)_LONG and the control line SSW_S(n)_SHORT is equal to a second separation distance 593 between the control line SSW_S(n+1)_LONG and the control line SSW_S(n+1)_SHORT.

It is appreciated that controlling operation of an imaging system with pixel cell circuitry, layout, and control line arrangement as illustrated in FIG. 5A-5C is similar in that of method 200 illustrated in FIG. 2A. One difference is that instead of performing selective readout (e.g., block 218-222), short exposure image and reset signals for each pixel is also stored or otherwise readout such that the image signals for each pixel includes both short exposure image signals and long exposure image signals and the reset signals include both short exposure reset signals and long exposure reset signals.

Figure 5D:
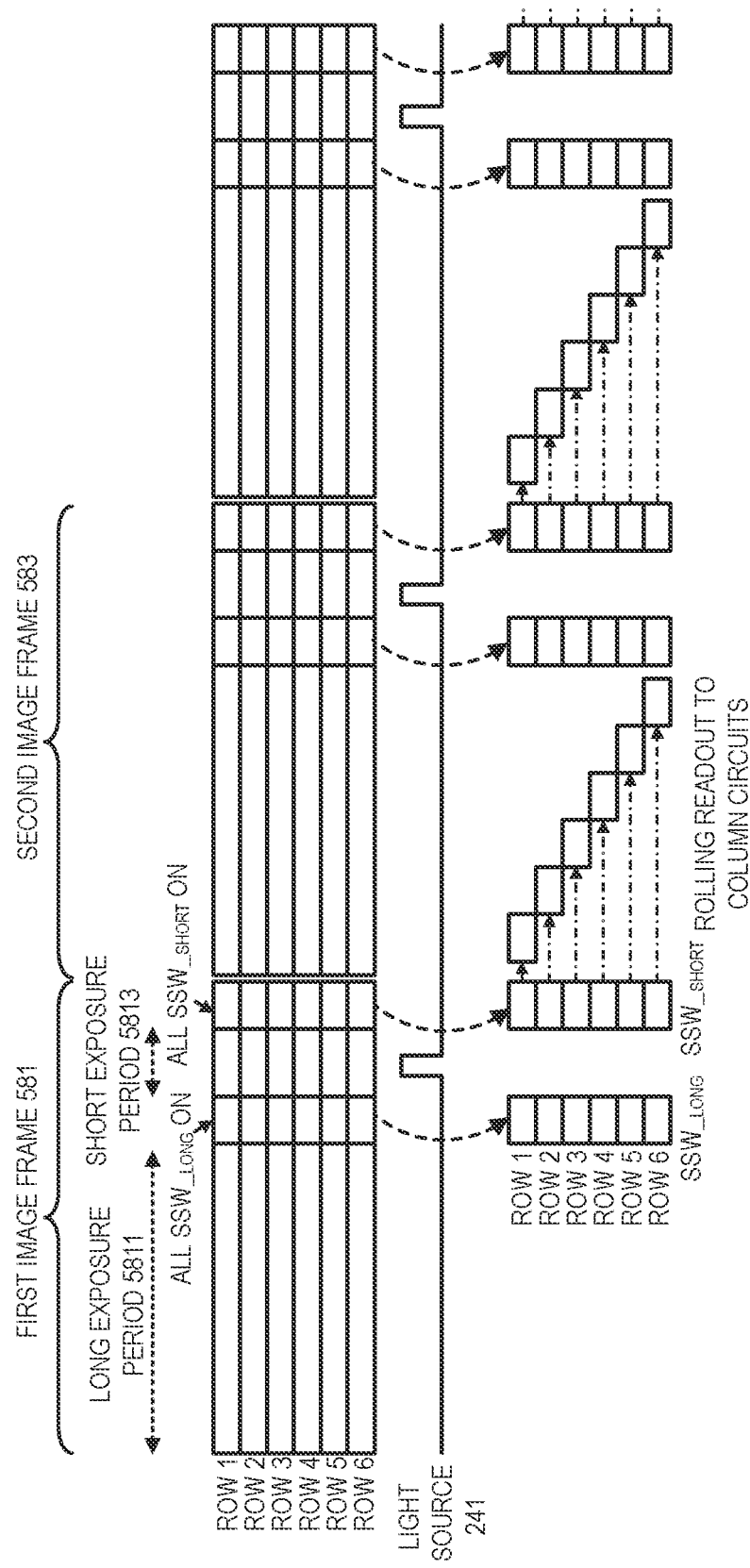
FIG. 5D illustrates an example timing diagram for capturing an image frame via selective readout during a long exposure period and a short exposure period of the image frame, in accordance with the teachings of the present disclosure.

FIG. 5D illustrates an example timing diagram 580 for capturing an image frame (e.g., first image frame 581 and second image frame 583) representative of an external scene via selective readout during a long exposure period and a short exposure period of the image frame (e.g., long exposure period 5811 and short exposure period 5813 of the first image frame 581), in accordance with the teachings of the present disclosure. The short exposure period has a duration less than the long exposure period. The timing diagram 580 provides a visual representation of an example photodiode exposure and readout from multiple rows of an image sensor or imaging system (e.g., the imaging system 100 illustrated in FIG. 1A and associated structure as illustrated in FIGS. 5A-5C). As discussed in embodiments previously, the plurality of pixels include visible color pixels (e.g., red, green, blue as indicated by the color filter arrangement shown in FIG. 5B and FIG. 5C). Prior to the long exposure period 5811, the photodiode (e.g., PD illustrated in FIG. 5A) and the floating diffusion region (e.g., corresponding floating diffusion region FD illustrated in FIG. 5A) of each visible color pixel are reset via applying a pulse to a corresponding reset control line RST1 and a transfer control line TX. -During the long exposure period 5811, the photodiodes included in each of visible pixels (e.g., PD illustrated in FIG. 5A) accumulates image charge. Then to end the long exposure period, the floating diffusion regions are reset via applying a pulse to a corresponding reset control line RST1, with reset signals readout to reset storage capacitors Cm associated with long exposure as illustrated in FIG. 5A via applying a pulse to a respective reset storage control line such as, SSW_R(n)_LONG and SSW_R(n+1)_LONG as illustrated in FIG. 5C, to turn on reset storage transistor $SSW_{RL}$ for each pixel included in the plurality of pixels to readout the reset signals to the reset storage capacitors (e.g., reset storage capacitor $C_{RL}$, illustrated in FIG. 5A) associated with each of the plurality of pixels. Thereafter, accumulated image charges are readout to the floating diffusion regions (e.g., corresponding floating diffusion region FD illustrated in FIG. 5A). Then storage transistors (e.g., storage transistors $SSW_{SL}$ associated with long exposure illustrated in FIG. 5A), via applying a pulse to a storage control line such as, SSW_S(n)_LONG and SSW_S(n+1)_LONG as illustrated in FIG. 5C, for each pixel included in the plurality of pixels, are turned ON to readout the long exposure image signals to the image storage capacitors (e.g., storage capacitor $C_{SL}$, illustrated in FIG. 5A) associated with each of the plurality of pixels. Shortly thereafter, the short exposure period 5813 starts, during which light source 241 emits a pulse of electromagnetic radiation (e.g., light having a wavelength between 800 nm to 3000 nm or otherwise corresponding to non-visible light or electromagnetic radiation) towards the external scene that the image sensor captures and charge is accumulated in the photodiode of each of the plurality of pixels. Then to end the short exposure period, the floating diffusion regions (e.g., floating diffusion region FD illustrated in FIG. 5A) are reset, with reset signal readout to reset storage capacitors $C_{RS}$ associated with short exposure illustrated in FIG. 5A by applying a pulse to a corresponding reset storage control line such as, SSW_R(n)_SHORT and SSW_R(n+1)_SHORT as illustrated in FIG. 5C, turning on storage transistors $SSW_{SS}$ for each pixel included in the plurality of pixels) to readout the reset signals to the reset storage capacitors (e.g., reset storage capacitor $C_{RS}$, illustrated in FIG. 5A) associated with each of the plurality of pixels. Thereafter, the accumulated image charges are readout to the floating diffusion regions (e.g., floating diffusion region FD illustrated in FIG. 5A), the storage transistors associated with short exposure included in each pixel are activated to readout the short exposure image signals (e.g., storage transistor $SSW_{SS}$ illustrated in FIG. 5A via applying a pulse to a storage control line such as SSW_S(n)_SHORT as illustrated in FIG. 5C). Afterwards, the next image frame (e.g., the second image frame 583) begins and rolling readout of the storage charge signals to generate image data of the first image frame 581 is performed. In other words, reading out the storage charge signals is done on a row-by-row basis to generate the image data.

FIG. 6 is a functional block diagram of an imaging system 600 with selective readout for visible-infrared image capture, in accordance with the teachings of the present disclosure. The imaging system 600 is one possible system that may implement the method 250 illustrated in FIG. 2A, the method 350 illustrated in FIG. 3A and FIG. 3B, and/or the method 550 illustrated in FIG. 5B. Accordingly, it is appreciated that the imaging system 600 may have a structure corresponding to or otherwise similar to the imaging system 100 illustrated in FIG. 1A-1F, the circuitry illustrated in FIG. 1D, FIG. 3A, FIG. 3B, FIG. 5A, the control line arrangements illustrated in FIG. 1E, FIG. 1F, FIG. 3A, FIG. 3B, FIG. 4, FIG. 5B, FIG. 5C, or combinations thereof, in accordance with the teachings of the disclosure. As illustrated, the imaging system 600 includes sensor wafer 601 coupled to logic wafer 651, optics 615, light source 617, and optics 619. The sensor wafer 601 includes a semiconductor material 631 (e.g., a silicon or wafer), a plurality of photodiodes 633, a plurality of color filters 635 (e.g., red, green, blue, infrared, or other color filters arranged over the plurality of photodiodes 633 to form one or more pixel cells), and a plurality of microlenses 637 arranged to focus portions of the incident light 698 on individual photodiodes included in the plurality of photodiodes 633. The light source 617 is optically coupled to the optics 619 (e.g., one or more optical components such as one or more lenses, filters, or other elements) and operable to emit a first spectrum of electromagnetic radiation (e.g., infrared light included a first wavelength between 800 nm and 3000 nm in wavelength) towards the external scene 603, which may then be reflected as the incident light 698 (e.g., during the short exposure period).

The logic wafer 651 functions, at least in part, as controller 610, which includes logic and/or circuitry to control the operation (e.g., during pre-, post-, and in situ phases of image and/or video acquisition) of the various components of imaging system 600. The controller 610 may be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 610 includes the processor 612 coupled to memory 614 that stores instructions for execution by the controller 610 or otherwise by one or more components of the imaging system 600. The instructions, when executed, may cause the imaging system 600 to perform operations that may be associated with the various functional modules, logic blocks, or circuitry of the imaging system 600 including any one of, or a combination of, control circuitry 616, readout circuitry 618, function logic 620, components of the sensor wafer 601, optics 615 (e.g., an objective lens with one or more optical components that may be adjusted to provide variable focus), and any other element of the imaging system 600 (illustrated or otherwise).

The memory 614 is a non-transitory machine-accessible (e.g., computer-readable) medium that may include, without limitation, a volatile (e.g., RAM) or non-volatile (e.g., ROM) storage system accessible/readable by controller 610.

In some embodiments, the machine capable of accessing the non-transitory machine-accessible medium corresponds to the imaging system 600, including the logic wafer 651 coupled to sensor wafer 601. In the same or other embodiments, the non-transitory machine-accessible storage medium corresponds to on-chip memory (e.g., memory 614 and/or function logic 620) of the machine (e.g., the imaging system 600 or components thereof) to capture visible-infrared images via selective readout.

Control circuitry 616 may control operational characteristics of the imaging system 600 (e.g., exposure duration, when to capture digital images or videos, and the like). Control circuitry 616 may further control operation of light source 617 in accordance to the imaging operation of the pixel cells formed of the plurality of photodiodes 633. Readout circuitry 618 reads or otherwise samples the analog signal from the individual photodiodes (e.g., readout electrical signals generated by each of the plurality of photodiodes 633 that are representative of image charge generated in response to incident light to generate a phase detection signal, readout image signals to capture an image frame or video, and the like) and may include amplification circuitry, analog-to-digital (ADC) circuitry, image buffers, or otherwise. In the illustrated embodiment, readout circuitry 618 is included in controller 610, but in other embodiments readout circuitry 618 may be separate from the controller 610. Function logic 680 is coupled to the readout circuitry 618 to receive the electrical signals to generate a phase-detection signal in response, generate an image in response to receiving image signals or data, and the like. In some embodiments, the electrical or image signals may be respectively stored as a phase detect signal or image data and may be manipulated by the function logic 420 to perform operations (e.g., calculate an expected image signal, bin image signals, demosaic the image data, apply post image effects such as crop, rotate, remove red eye, adjust brightness, adjust contrast, detect a presence of an occlusion, or otherwise).

It is appreciated that imaging systems discussed herein (e.g., imaging system 100 illustrated in FIG. 1A-1F and imaging system 600 illustrated in FIG. 6) may be fabricated by semiconductor device processing and microfabrication techniques known by one of ordinary skill in the art. In one embodiment, fabrication of imaging system 600 may include providing a semiconductor material (e.g., a silicon wafer having a front side and a back side), forming a mask or template (e.g., out of cured photoresist) on the front side of the semiconductor material via photolithography to provide a plurality of exposed regions of the front side of semiconductor material, doping (e.g., via ion implantation, chemical vapor deposition, physical vapor deposition, and the like) the exposed portions of the semiconductor material to form the plurality of photodiodes 635 that extend into semiconductor material from the front side of semiconductor material, removing the mask or template (e.g., by dissolving the cured photoresist with a solvent), and planarizing (e.g., via chemical mechanical planarization or polishing) the front side of semiconductor material. In the same or another embodiment, photolithography may be similarly used to form the plurality of color filters 635 and the plurality of microlenses 637 (e.g., individual or shared microlenses which may be polymer based microlenses having a target shape and size formed from a master mold or template). It is appreciated that the described techniques are merely demonstrative and not exhaustive and that other techniques may be utilized to fabricate one or more components of various embodiments of the disclosure.

The processes explained above may be implemented using software and/or hardware. The techniques described may constitute machine-executable instructions embodied within a tangible or non-transitory machine (e.g., computer) readable storage medium, that when executed by a machine (e.g., controller 610 of FIG. 6) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging system, comprising:
   a sensor wafer, including:
   a plurality of pixels arranged in rows and columns, the plurality of pixels including at least a first pixel and a second pixel positioned in a first row included in the rows, wherein each pixel included in the plurality of pixels includes a respective photodiode configured to accumulate image charge in response to incident light; and
   a first transfer control line associated with the first row, wherein the first transfer control line is coupled to both a first transfer gate of the first pixel and a second transfer gate of the second pixel; and
   a logic wafer coupled to the sensor wafer, the logic wafer including:
   a plurality of storage capacitors, each associated with a respective one of the plurality of pixels of the sensor wafer, wherein the plurality of storage capacitors includes a first storage capacitor associated with the first pixel and a second storage capacitor associated with the second pixel;
   a first storage control line coupled to a first storage gate associated with the first pixel, wherein the first storage gate is included in a first storage transistor coupled to the first storage capacitor; and
   a second storage control line coupled to a second storage gate associated with the second pixel, and wherein the second storage gate is included in a second storage transistor coupled to the second storage capacitor.

2. The imaging system of claim 1, wherein the first storage control line is separate from the second storage control line to provide selective readout to at least one of the first storage capacitor or the second storage capacitor.

3. The imaging system of claim 2, wherein the first pixel is a visible color pixel and the second pixel is an infrared pixel adjacent to the visible color pixel.

4. The imaging system of claim 1, wherein the sensor wafer includes a floating diffusion region coupled to the respective photodiodes of the first pixel and the second pixel via the first transfer gate and the second transfer gate to selectively readout the image charge from the first pixel and the second pixel.

5. The imaging system of claim 1, wherein the plurality of pixels included in the sensor wafer further includes a third pixel and a fourth pixel positioned in a second row included in the rows, wherein the second row is adjacent to the first row such that the first pixel, the second pixel, the third pixel, and the fourth pixel form a first pixel cell included in a plurality of pixel cells of the imaging system, wherein the plurality of storage capacitors included in the logic wafer includes a third storage capacitor associated with the third pixel and a fourth storage capacitor associated with the fourth pixel, and wherein the logic wafer further includes:
a third storage control line coupled to both a third storage gate associated with the third pixel and a fourth storage gate associated with the fourth pixel, wherein the third storage gate is included in a third storage transistor coupled to the third storage capacitor, wherein the fourth storage gate is included in a fourth storage transistor coupled to the fourth storage capacitor.

6. The imaging system of claim 5, wherein the first pixel cell is analogous to a minimal repeating unit of the imaging system.

7. The imaging system of claim 5, wherein the logic wafer further includes a dummy storage control line positioned proximate to the third storage control line, wherein the dummy storage control line is not connected to any gate, including the first storage gate, the second storage gate, the third storage gate, and the fourth storage gate, associated with the first pixel, the second pixel, the third pixel, or the fourth pixel.

8. The imaging system of claim 7, wherein, during operation of the imaging system, the dummy storage control line is biased to a pre-determined value corresponding to a logic low of the third storage control line.

9. The imaging system of claim 7, wherein the dummy storage control line is positioned to maintain control line symmetry of the logic wafer such that a first separation distance between the first storage control line and the second storage control line is equal to a second separation distance between the third storage control line and the dummy storage control line.

10. The imaging system of claim 1, wherein the logic wafer further includes:
a plurality of reset storage capacitors, including a first reset storage capacitor associated with the first pixel and a second reset storage capacitor associated with the second pixel;
a first reset storage control line coupled to a first reset storage gate associated with the first pixel, wherein the first reset storage gate is included in a first reset storage transistor coupled to the first reset storage capacitor; and
a second reset storage control line coupled to a second reset storage gate associated with the second pixel, and wherein the second reset storage gate is included in a second reset storage transistor coupled to the second reset storage capacitor, and wherein the first reset storage control line is separate from the second reset storage control line to provide selective readout to at least one of the first reset storage capacitor or the second reset storage capacitor.

11. The imaging system of claim 1, wherein the logic wafer further includes a reset transistor associated with the first pixel, the reset transistor coupled between the first storage transistor of the logic wafer and a floating diffusion region included in the first pixel of the sensor wafer.

12. The imaging system of claim 1, wherein the first pixel and the second pixel are different visible color pixels adjacent to one another.

13. The imaging system of claim 12, wherein the logic wafer further includes:
a first group of four capacitors, including the first storage capacitor, each associated with the first pixel; and
a second group of four capacitors, including the second storage capacitor, each associated with the second pixel, wherein the first storage control line is further coupled to a transistor gate associated with a capacitor included in the second group of four capacitors other than the second storage capacitor, and wherein the second storage control line is further coupled to a transistor gate associated with a capacitor included in the first group of four storage capacitors other than the first storage capacitor.

14. The imaging system of claim 1, further comprising a light source adapted to emit a first spectrum of electromagnetic radiation during a short exposure period of an image frame capture operation, the first spectrum including at least a first wavelength, and wherein the second pixel is more sensitive to the first wavelength than the first pixel.

15. A logic wafer of an imaging system, the logic wafer comprising:
a plurality of storage capacitors, each configured to store image signals associated with a respective one of a plurality of pixels, wherein the plurality of storage capacitors includes a first storage capacitor associated with a first pixel included in a first row of the plurality of pixels and a second storage capacitor associated with a second pixel included in the first row of the plurality of pixels;
a first storage control line coupled to a first storage gate associated with the first pixel, wherein the first storage gate is included in a first storage transistor coupled to the first storage capacitor; and
a second storage control line coupled to a second storage gate associated with the second pixel, and wherein the second storage gate is included in a second storage transistor coupled to the second storage capacitor.

16. The logic wafer of claim 15, wherein the first storage control line is separate from the second storage control line to provide selective readout to at least one of the first storage capacitor or the second storage capacitor.

17. The logic wafer of claim 15, further comprising a third storage control line coupled to both a third storage gate associated with a third pixel included in the plurality of pixels and a fourth storage gate associated with a fourth pixel included in the plurality of pixels, wherein the third pixel and the fourth pixel are positioned in a second row of the plurality of pixels that is adjacent to the first row, wherein the third storage gate is included in a third storage transistor coupled to a third storage capacitor included in the plurality of storage capacitors, and wherein the fourth storage gate is included in a fourth storage transistor coupled to a fourth storage capacitor included in the plurality of storage capacitors.

18. The logic wafer of claim 17, further including a dummy storage control line positioned proximate to the third storage control line, wherein the dummy storage control line is not connected to any gate, including the first storage gate, the second storage gate, the third storage gate, and the fourth storage gate, associated with the first pixel, the second pixel, the third pixel, and the fourth pixel.

19. The logic wafer of claim 18, wherein the dummy storage control line is positioned to maintain control line symmetry of the logic wafer such that a first separation distance between the first storage control line and the second storage control line is equal to a second separation distance between the third storage control line and the dummy storage control line.

20. The logic wafer of claim 15, wherein the plurality of storage capacitors further includes a third storage capacitor associated with a third pixel included in the first row of the plurality of pixels, wherein the first pixel is a visible color pixel, the second pixel is a first infrared pixel adjacent to the first pixel, and the third pixel is a second infrared pixel, wherein the first storage control line is further coupled to a third storage gate associated with the third pixel, and wherein the third storage gate is included in a third storage transistor coupled to the third storage capacitor.

21. The logic wafer of claim 15, further comprising:
a third storage capacitor associated with a third pixel and a fourth storage capacitor associated with a fourth pixel; and
a third storage control line coupled to a third storage gate associated with the third pixel and a fourth storage gate associated with the fourth pixel, wherein the third storage gate is included in a third storage transistor coupled to the third storage capacitor, and wherein the fourth storage gate is included in a fourth storage transistor coupled to the fourth storage capacitor.

22. The logic wafer of claim 21, wherein the first pixel and the third pixel are visible color pixels, wherein the second pixel and the fourth pixel are infrared pixels, wherein the second pixel is adjacent to the first pixel, and wherein the fourth pixel is adjacent to the third pixel.

23. The logic wafer of claim 22, wherein the third pixel and the fourth pixel are included in the first row of the plurality of pixels, and
wherein the third storage control line is the first storage control line that is separate from the second storage control line to provide selective readout to the second storage capacitor relative to the first storage capacitor, the third storage capacitor, and the fourth storage capacitor by the first storage control line.

* * * * *